(12) United States Patent
Koellmann

(10) Patent No.: US 7,498,893 B2
(45) Date of Patent: Mar. 3, 2009

(54) CIRCUIT FOR GENERATING A HIGH-FREQUENCY OSCILLATION IN A SPECIFIED FREQUENCY BAND

(75) Inventor: Andreas Koellmann, Hamburg (DE)

(73) Assignee: NXP B.V., Eindhoven (NL)

( * ) Notice: Subject to any disclaimer, the term of this patent is extended or adjusted under 35 U.S.C. 154(b) by 21 days.

(21) Appl. No.: 10/537,855

(22) PCT Filed: Dec. 4, 2003

(86) PCT No.: PCT/IB03/05868

§ 371 (c)(1), (2), (4) Date: Nov. 8, 2005

(87) PCT Pub. No.: WO2004/054090

PCT Pub. Date: Jun. 24, 2004

(65) Prior Publication Data

US 2006/0049884 A1    Mar. 9, 2006

(30) Foreign Application Priority Data

Dec. 11, 2002 (EP) .................... 02102730

(51) Int. Cl.
  *H03B 5/36* (2006.01)
(52) U.S. Cl. ............... 331/158; 331/77; 331/175
(58) Field of Classification Search .............. 331/74, 331/77, 158, 175
See application file for complete search history.

(56) References Cited

U.S. PATENT DOCUMENTS

| | | | |
|---|---|---|---|
| 4,378,532 A * | 3/1983 | Burgoon | 331/158 |
| 5,136,263 A | 8/1992 | Lane | |
| 6,169,460 B1 * | 1/2001 | Wordelman | 331/116 R |
| 6,696,898 B1 * | 2/2004 | Ward et al. | 331/116 FE |
| 6,778,030 B2 * | 8/2004 | Kobayashi et al. | 331/73 |
| 6,798,301 B1 * | 9/2004 | Balan et al. | 331/74 |

* cited by examiner

*Primary Examiner*—Robert Pascal
*Assistant Examiner*—James E Goodley
(74) *Attorney, Agent, or Firm*—Aaron M Waxler

(57) ABSTRACT

An oscillator circuit for generating a high-frequency electromagnetic oscillation, comprises:—an amplifier configuration with at least one input and at least one output,—an oscillator crystal connected to at least one of the outputs of the amplifier configuration,—a bandpass filter configuration, which is connected, with at least one input, to the oscillator crystal and the at least one output of the amplifier configuration connected to the oscillator crystal, and back coupled, with at least one output, to the input, or at least one of the inputs, of the amplifier configuration. Through dimensioning of the amplitude-frequency characteristic and/or the phase-frequency characteristic of the band-pass filter configuration as a function of the amplitude-frequency characteristic and the phase-frequency characteristic of the amplifier configuration and the crystal oscillator, the oscillation condition is hereby fulfilled exclusively for a selected harmonic of the oscillator crystal, and the high-frequency, electromagnetic oscillation formed by this selected harmonic of the oscillator crystal is available at the output of the bandpass filter configuration. This oscillator circuit is simply constructed and enables operation that is at least largely non-susceptible to interference.

20 Claims, 11 Drawing Sheets

CIRCUIT FOR GENERATING A HIGH-FREQUENCY OSCILLATION IN A SPECIFIED FREQUENCY BAND

The invention relates to an oscillator circuit for generating a high-frequency electromagnetic oscillation.

Known from the monograph "Halbleiter-Schaltungstechnik" (*Semiconductor circuitry*) by U. Tietze and Ch. Schenk, 8th edition, Springer-Verlag, 1986, section 15.2.2, pp 450, 451, is a Pierce oscillator, which is designed as a fundamental frequency oscillator with an oscillator crystal. In a fundamental frequency oscillator of this kind, the circuit configuration oscillates on the fundamental wave of the oscillator crystal.

It is further known from the above-cited monograph "Halbleiter-Schaltungstechnik", section 15.2.3, pp 452 to 454, that oscillator crystals are difficult to produce for frequencies above 30 MHz. As a solution for generating high frequencies of this kind with crystal stability, it is proposed therein to excite an oscillator crystal on a harmonic wave, since, in the case of odd-order harmonics, an oscillator crystal also possesses resonance points. According to the cited document, in order to excite a crystal on a harmonic wave, an amplifier is required, the gain of which has a maximum in the vicinity of the desired frequency. To this end, the use of an additional LC resonant circuit tuned to the desired harmonic wave is proposed. A correspondingly modified Hartley oscillator and a Colpitts oscillator are proposed.

The proposed oscillators have the disadvantage that they are equipped with an LC resonant circuit. A resonant circuit of this kind is relatively expensive to produce and, in comparison with modern integrated semiconductor circuits, requires a great deal of space. In addition, it is a component that has to be assigned externally to an integrated semiconductor circuit of this kind, which is not desirable either, on grounds of space and cost.

Strictly speaking, in an oscillator of this kind, any undesired resonant frequency, but at least every resonant frequency of the oscillator crystal that is lower than the desired frequency of the oscillator, also has to be attenuated by a separate LC series resonant circuit, i.e. when, for example, the fifth harmonic is operated, the fundamental wave and the third harmonic have to be attenuated by an appropriately tuned LC series resonant circuit. Therefore, only harmonic oscillators with fundamental wave suppression that are operated on the third harmonic are commonly encountered in practice.

In circuit configurations containing, in mixed construction, circuit stages for processing analog and digital signals, most crystal oscillators produced in integrated CMOS semiconductor technology show a sharp increase in instabilities, also known as "jitter", with increasing interference in respect of the semiconductor substrate potential or the supply voltage, both of which kinds may be caused by e.g. digital signals in the integrated circuit. If oscillators of this kind are used to generate a clock signal, the cited instabilities arise in this clock signal and cannot be completely eliminated by a downstream phase-locked loop (PLL).

It is an object of the invention to create an oscillator circuit that has a simple structure and enables operation that is at least largely non-susceptible to the above-described interference.

The object is achieved in accordance with the invention by means of an oscillator circuit for generating a high-frequency, electromagnetic oscillation, comprising:
an amplifier configuration with at least one input and at least one output,
an oscillator crystal connected to at least one of the outputs of the amplifier configuration,
a bandpass filter configuration, which is connected, with at least one input, to the oscillator crystal and the at least one output of the amplifier configuration connected to the oscillator crystal, and back coupled, with at least one output, to the input, or at least one of the inputs, of the amplifier configuration, wherein, through dimensioning of the amplitude-frequency characteristic and/or the phase-frequency characteristic of the bandpass filter configuration as a function of the amplitude-frequency characteristic and the phase-frequency characteristic of the amplifier configuration and the oscillator crystal, the oscillation condition is fulfilled exclusively for a selected harmonic of the oscillator crystal, and the high-frequency, electromagnetic oscillation formed by this selected harmonic of the oscillator crystal is available at the output of the bandpass filter configuration.

The oscillator circuit in accordance with the invention enables the generation of a selected harmonic of the oscillator crystal (also designated overtone oscillation) without a component to be assigned externally to an oscillator circuit of this kind, constructed as an integrated semiconductor circuit, in particular without additional external components on the terminals provided for connection of the oscillator crystal to the oscillator circuit, i.e. the crystal terminals of the oscillator circuit. In many cases, the direct generation of an oscillator crystal harmonic of this kind and its use as a clock signal in signal processing configurations to be used with the oscillator circuit in accordance with the invention renders frequency synthesis by means of PLL from a lower crystal oscillator frequency unnecessary. In cases in which a clock signal is to be generated without PLL, by comparison with an oscillator crystal of the same frequency (also designated a fundamental wave crystal), which is operated in its fundamental mode and generates a corresponding clock signal, the oscillator circuit in accordance with the invention enables a more cost-effective use of an oscillator crystal (also designated an overtone crystal) operated on a harmonic of this kind.

In addition, the oscillator circuit in accordance with the invention enables an oscillation generation, and thereby a clock signal generation, which is at least largely free of the instabilities known as "jitter" even in the case of strong interference of the semiconductor substrate potential or the supply voltage in an oscillator circuit of this kind, constructed as an integrated semiconductor circuit. The oscillator circuit in accordance with the invention is therefore especially suitable for use in integrated semiconductor circuits which contain, in mixed construction, circuit stages for processing analog and digital signals.

In an advantageous further embodiment of the oscillator circuit in accordance with the invention, the amplifier configuration is designed with, in each case, at least one pair of at least virtually symmetrical inputs and outputs (differential inputs and outputs) for processing electromagnetic oscillations (known as differential signals), operated at least virtually symmetrically relative to a first reference potential. Preferably selected as the first reference potential hereby is a direct-current operating point of the amplifier configuration. The direct-current operating points of the amplifier configuration and of the oscillator circuit as a whole preferably correspond hereby.

In another further embodiment of the oscillator circuit in accordance with the invention, the amplifier configuration comprises a differential amplifier circuit, which is equipped with two field effect transistors coupled at their source terminals, the gate terminals of which are each coupled with one of the differential inputs of the amplifier configuration, wherein a drain terminal of each field effect transistor forms one of the differential outputs of the amplifier configuration, each of which is further coupled, via a load path, each of which comprises at least one field effect transistor, designated an output load transistor, with a terminal carrying a second reference potential. A ground potential is hereby preferably selected as the second reference potential.

The amplifier configuration hereby preferably comprises a control-voltage generation stage for generating a control voltage, which is supplied to gate terminals of the output load transistors. In particular, the control-voltage generation stage herein comprises a series circuit comprising a constant current source and a field effect transistor bridged between its drain terminal and gate terminal.

An advantageous further embodiment of the oscillator circuit in accordance with the invention is further characterized in that the amplifier configuration comprises an operating-point regulating stage with three field effect transistors, a first of which is disposed in the first load path and a second of which is disposed in the second load path, each connected in series with the output load transistor there, and a third of which is connected in series with the series circuit comprising the constant current source and field effect transistor of the control-voltage generation stage, wherein a gate terminal of the first of the three field effect transistors of the operating-point regulating stage is connected to a first of the differential outputs of the amplifier configuration, wherein a gate terminal of the second of the three field effect transistors of the operating-point regulating stage is connected to a second of the differential outputs of the amplifier configuration, wherein a gate terminal of the third of the three field effect transistors of the operating-point regulating stage is connected to the gate terminals of the output load transistors and wherein the three field effect transistors of the operating-point regulating stage are routed, with their source terminals, to the terminal carrying the second reference potential.

In accordance with another advantageous embodiment of the oscillator circuit in accordance with the invention, the amplifier configuration comprises an offset compensation device comprising, in each case, a high-pass circuit between:
  each of the differential inputs of the amplifier configuration,
  the gate terminal of the field effect transistor of the differential amplifier circuit comprising the amplifier configuration that is coupled with this differential input,
  the differential output formed by the drain terminal of said field effect transistor. The limiting frequency of this high-pass circuit is small as compared with the frequency operating range of the oscillator circuit.

In a preferred further embodiment of this oscillator circuit in accordance with the invention, each of the high-pass circuits contains a capacitor, via which the differential input of the amplifier configuration is coupled with the gate terminal of the field effect transistor of the differential amplifier circuit comprising the amplifier configuration, and each of the high-pass circuits further contains an ohmic resistance element, via which the gate terminal of the field effect transistor of the differential amplifier circuit comprising the amplifier configuration is coupled with the differential output of the amplifier configuration formed by the drain terminal of this field effect transistor.

In accordance with another embodiment of the oscillator circuit in accordance with the invention, the amplifier configuration is coupled with an auxiliary starting circuit, by means of which, during a predetermined period when the oscillator circuit is put into operation, a differential voltage is supplied to the gate terminals of the field effect transistors, coupled at their source terminals, of the differential amplifier circuit comprising the amplifier configuration.

The auxiliary starting circuit preferably comprises:
  a first field effect transistor, which is disposed between the gate terminal of a first of the field effect transistors, coupled at their source terminals, of the differential amplifier circuit comprising the amplifier configuration, and a third reference potential;
  a second field effect transistor, which is disposed between the gate terminal of a second of the field effect transistors, coupled with their source terminals, of the differential amplifier circuit comprising the amplifier configuration, and the third reference potential;
  a start-signal input for supplying an at least largely pulse-shaped or step-shaped start signal when the oscillator circuit is put into operation;
  a delay stage;

wherein the start-signal input is directly coupled with a gate terminal of the first field effect transistor of the auxiliary starting circuit and, via the delay stage, with a gate terminal of the second field effect transistor of the auxiliary starting circuit. A supply voltage emitted at a supply-voltage terminal is hereby preferably selected as the third reference potential.

In another advantageous embodiment of the oscillator circuit in accordance with the invention, the oscillator crystal takes the form of a two-terminal network and is connected with, in each case, one of its terminals to, in each case, one of the outputs of a pair of differential outputs of the amplifier configuration, in order to supply an electromagnetic oscillation emitted by the amplifier configuration in the form of a differential signal.

In another advantageous embodiment of the oscillator circuit in accordance with the invention, the bandpass filter configuration is designed with, in each case, at least one pair of at least virtually symmetrical input and outputs (known as differential inputs and outputs) for processing electromagnetic oscillations (known as differential signals), operated at least virtually symmetrically relative to a fourth reference potential. Preferably selected as this fourth reference potential is a direct-current operating point of the bandpass filter configuration.

The direct-current operating point of the bandpass filter configuration hereby preferably corresponds with that of the oscillator circuit as a whole. So, in this case, the fourth reference potential of the bandpass filter configuration resembles the first reference potential of the amplifier configuration, and thereby the direct-current operating point of the oscillator circuit as a whole.

In accordance with an advantageous further embodiment of the oscillator circuit in accordance with the invention, the bandpass filter configuration is connected, with at least one pair of its differential inputs, to at least the pair of differential outputs of the amplifier configuration that are connected to the terminals of the oscillator crystal, and, with at least one pair of its differential outputs, to at least one pair of differential inputs of the amplifier configuration.

In accordance with an advantageous further embodiment of this oscillator circuit in accordance with the invention, the bandpass filter configuration is designed with a cascode connection of at least two bandpass stages of low quality. It is true that a design with only one bandpass stage of higher quality would also be possible. However, bandpass stages of this kind exhibit a higher power consumption than those of low quality. In addition, typical production tolerances of integrated semiconductor circuits mean that high-quality bandpass stages are more difficult to produce with the required accuracy while adhering to the mid-frequency of the bandpass filter configuration. Production is therefore simplified and the power requirement of the oscillator circuit is reduced by said preferred development.

In particular, the bandpass stages are hereby designed, in an advantageous manner, each with a differential amplifier circuit having two field effect transistors coupled at their source terminals, and with one pair of differential inputs and one pair of differential outputs, wherein each one of the differential inputs is coupled, via one of the high-pass circuits, with one of the gate terminals of one of the field effect transistors, and each one of the drain terminals of the field effect transistors forms one of the differential outputs of the bandpass stages, each of which drain terminal is further connected, via one of the low-pass circuits, to a terminal carrying a fifth reference potential, wherein the differential inputs of a first of the bandpass stages disposed in a cascade connection form the differential inputs of the bandpass filter configuration that are connected to the terminals of the oscillator crystal, and wherein the differential outputs of a last of the bandpass stages disposed in a cascade connection form the differential outputs of the bandpass filter configuration that are connected to the differential inputs of the amplifier configuration. A ground potential is preferably selected as the fifth reference potential. The second reference potential thereby preferably corresponds with the fifth reference potential.

In accordance with an advantageous development of the oscillator circuit in accordance with the invention, the high-pass circuits and/or the low-pass circuits are designed as RC networks. These may be constructed for the high frequencies to be generated in integrated semiconductor technology on a common semiconductor body with the remaining components of the oscillator circuit.

The RC networks are preferably equipped with switchable ohmic resistors. A change is thereby possible in the filter characteristic curves of the high-pass circuits and/or low-pass circuits constructed, in accordance with the invention, with said RC networks. In particular, an advantageous configuration is achieved by means of an additional trimming circuit to trim the resistance values of the switchable ohmic resistors in the RC networks with a reference resistor. In many cases, a reference resistor of this kind, which is generally disposed outside of an integrated semiconductor circuit, is present in any event, in particular for circuit configurations in which analog and digital signals are processed jointly, and therefore does not have to be additionally provided for the oscillator circuit in accordance with the invention. By means of the trimming circuit, trimming is undertaken, in particular during or directly following the starting-up of the oscillator circuit, i.e. the powering-up of the supply voltage. A comparison is hereby made with the precise, external reference resistor and, in the event of discrepancies, the ohmic resistors to be trimmed in the RC networks are switched to a correct resistance value, as a result of which production-related fluctuations of these resistance values can be minimized.

In accordance with another embodiment, the oscillator circuit in accordance with the invention comprises a converter circuit, coupled with at least one pair of differential outputs of the bandpass filter configuration, for converting the differential signal emitted by these differential outputs into an electromagnetic oscillation operated asymmetrically relative to the fourth reference potential. As a result, the oscillator circuit can be designed to process differential signals, whereas its output signal, the oscillation to be delivered, can be supplied as an asymmetrically operated signal.

The design of the oscillator circuit in accordance with the invention for processing differential signals proves to be an especially advantageous means of reducing susceptibility to interference, as mentioned above, affecting the semiconductor substrate potential or the supply voltage, which is one cause of said instabilities, designated "jitter". Through this design of the oscillator circuit, its robustness to these instabilities is considerably improved.

One advantageous further embodiment of the oscillator circuit in accordance with the invention is further characterized in that the converter circuit comprises:

an input stage designed as a differential amplifier with field effect transistors coupled at their source terminals, to which the differential signal to be converted is supplied;

a first current mirror stage designed with field effect transistors coupled via their gate terminals, to mirror a first differential output signal of the input stage of the converter circuit into a first intermediate signal;

a second current mirror stage designed with field effect transistors coupled via their gate terminals, to mirror a second differential output signal of the input stage of the converter circuit into a second intermediate signal;

a third current mirror stage designed with field effect transistors coupled via their gate terminals, to mirror the first intermediate signal of the first current mirror stage of the converter circuit into a third intermediate signal;

a subtraction circuit, designed as a current node, to subtract the second intermediate signal from the third intermediate signal;

an output driver circuit; wherein the third current mirror stage is further coupled with:

an auxiliary switch-on stage with a first cascode field effect transistor in the input arm of the third current mirror stage;

an auxiliary switch-off stage, comprising:

a first cascaded stage with a series circuit comprising:

a first field effect transistor, which is incorporated into the second current mirror stage and which is operated, jointly with the second current mirror stage, by the second differential output signal of the input stage of the converter circuit, to emit a fourth intermediate signal, which is, at least over segments, essentially proportional to the second intermediate signal;

an input transistor, designed as a field effect transistor, of a fourth current mirror stage;

a second cascade field effect transistor in the input arm of the fourth current mirror stage;

the fourth current mirror stage to mirror the fourth intermediate signal into a fifth intermediate signal and to supply it to the third current mirror stage, comprising:

the input transistor, designed as a field effect transistor, to supply the fourth intermediate signal;

an output transistor, designed as a field effect transistor, to emit the fifth intermediate signal;

and wherein a cascode bias-voltage generating circuit is provided to supply a common cascode bias voltage to gate terminals, coupled together, of the first and second cascode field effect transistors.

By means of this design of the converter circuit, the edge steepness of the output signal of the oscillator circuit, i.e. the oscillation to be supplied by it, can be increased. A further reduction is thereby achieved in the dependence of this output signal on the interference, as mentioned above, affecting the semiconductor substrate potential or the supply voltage, which is one cause of said instabilities, designated "jitter".

In a further embodiment of the invention, the cascode-bias-voltage generating circuit comprises a series circuit comprising a first and a second field effect transistor and a constant current source, which is disposed between a terminal carrying a sixth reference potential and a terminal carrying a seventh reference potential, wherein this first field effect transistor is connected, with its drain terminal, to a source terminal of the second field effect transistor, and gate terminals of this first and this second field effect transistor are connected to each other, to a drain terminal of the second field effect transistor and to the gate terminals of the first and the second cascode field effect transistors to supply the common cascode bias voltage. The sixth reference potential is hereby preferably selected to be equivalent to the second reference potential, and the seventh reference potential to be equivalent to the third reference potential, so the sixth reference potential preferably corresponds to the ground potential, and the seventh reference potential preferably corresponds to the supply voltage.

The invention will be further described with reference to examples of embodiments shown in the drawings, to which, however, the invention is not restricted.

Figure 8:
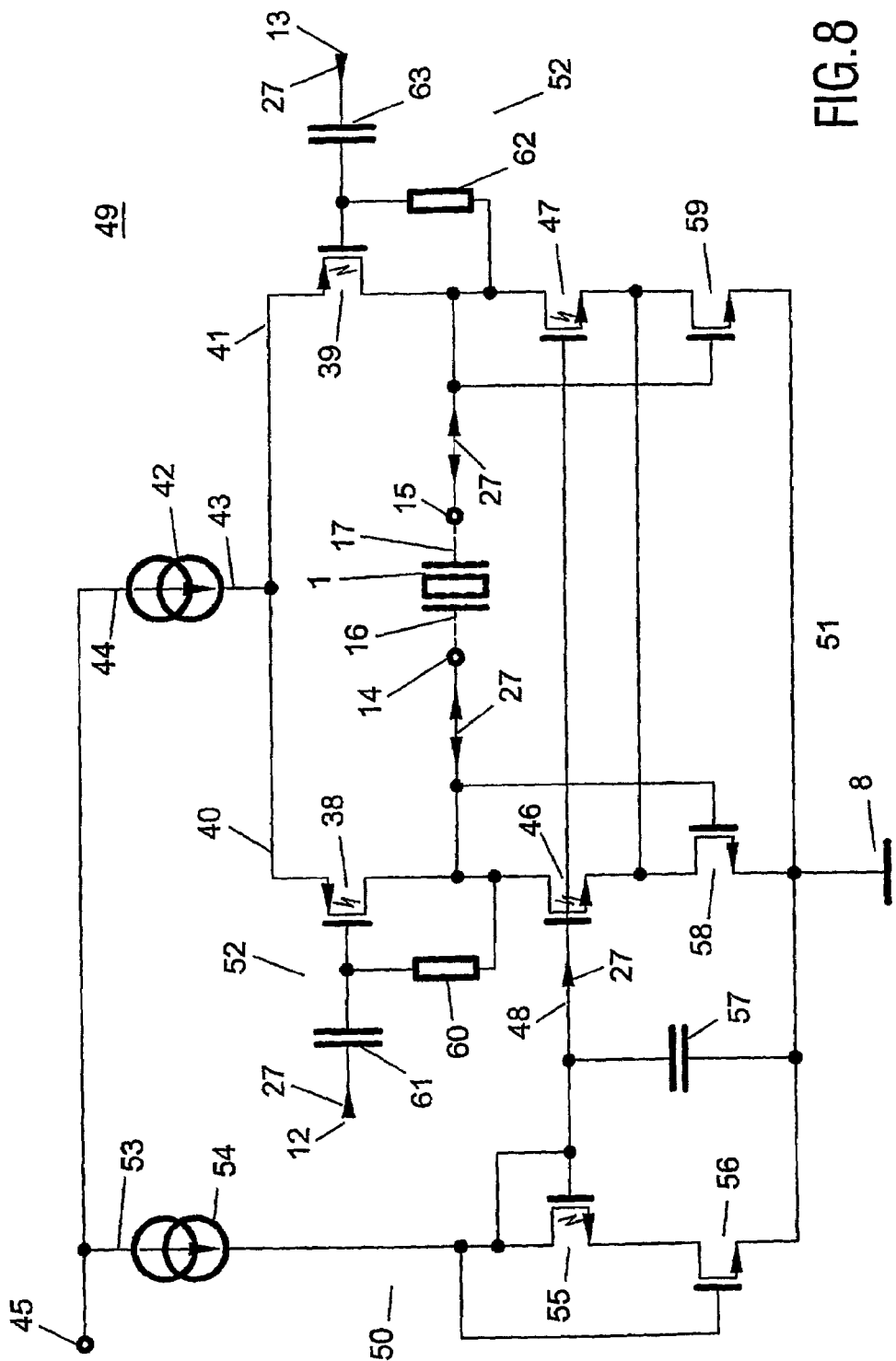
FIG. 8 shows a schematic circuit diagram of one example of embodiment of an improved amplifier configuration in an oscillator circuit in accordance with the invention.
Figure 9:
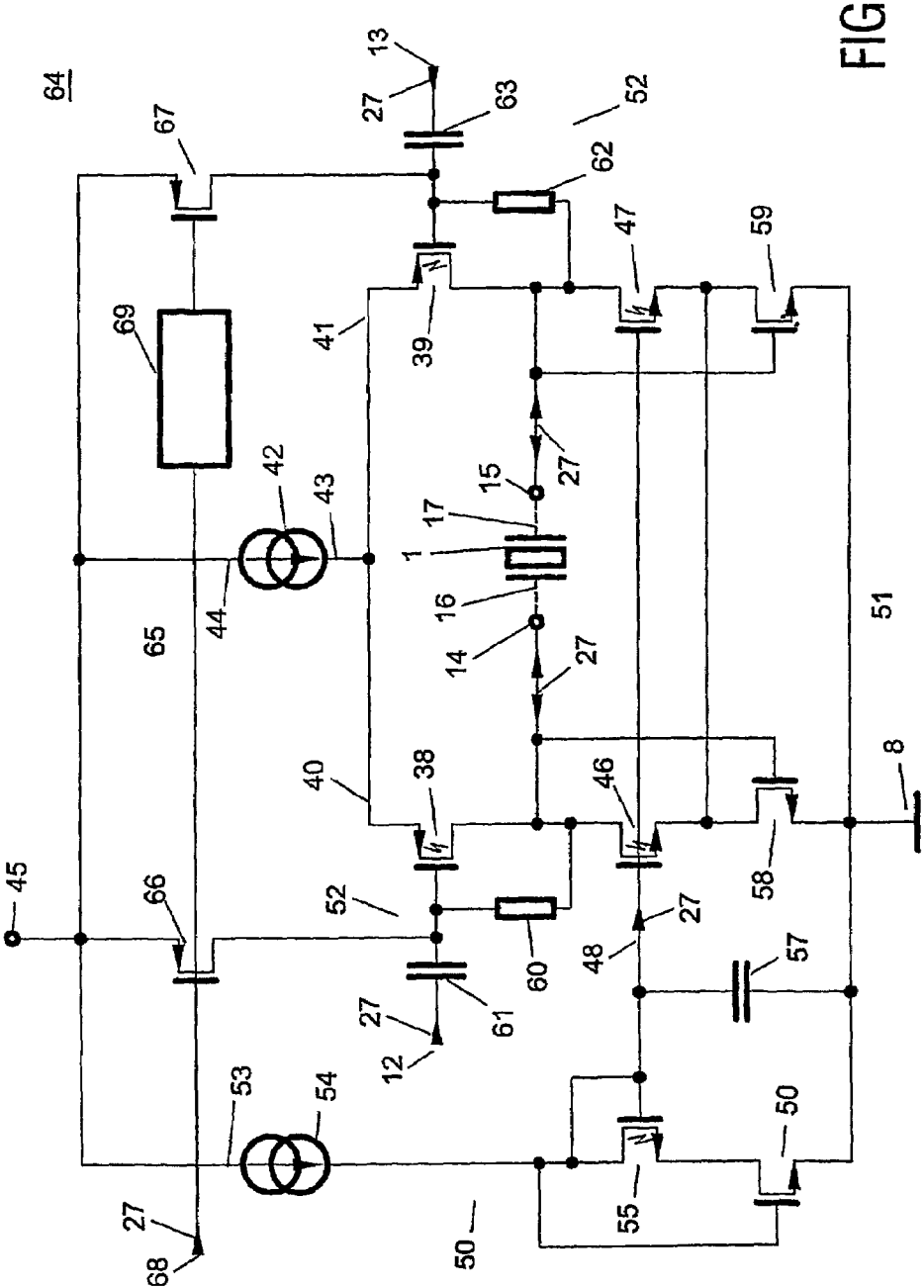
FIG. 9 shows a schematic circuit diagram of one example of embodiment of a further improved amplifier configuration in an oscillator circuit in accordance with the invention.
Figure 10:
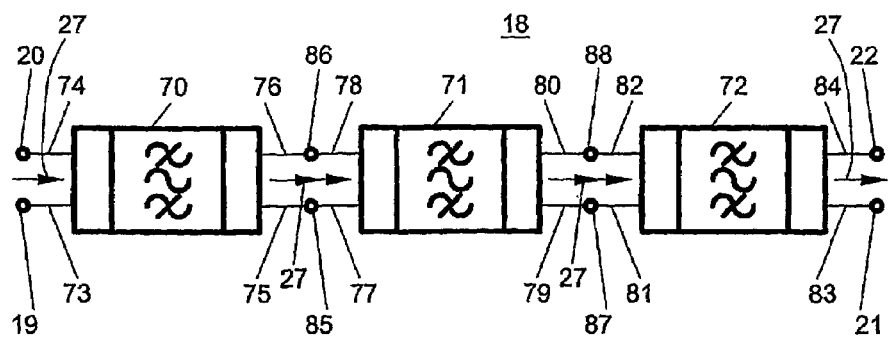
FIG. 10 shows an example of embodiment of a bandpass filter configuration in an oscillator circuit in accordance with the invention with a cascade connection of three bandpass stages.
Figure 11:
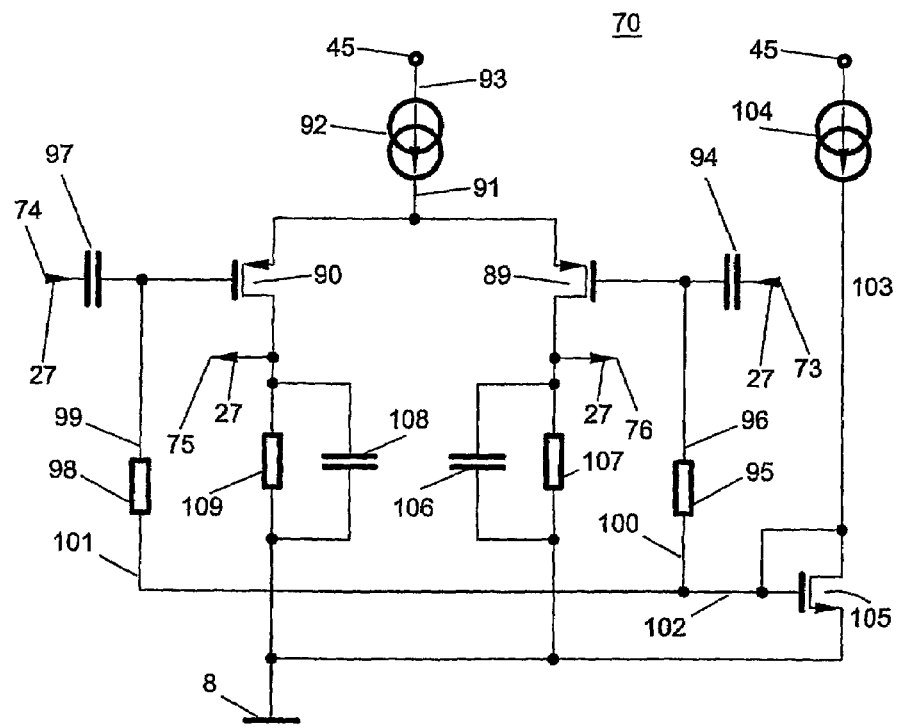
FIG. 11 shows an example of embodiment of a bandpass stage from the example of embodiment of the bandpass filter configuration in accordance with FIG. 10.
Figure 12:
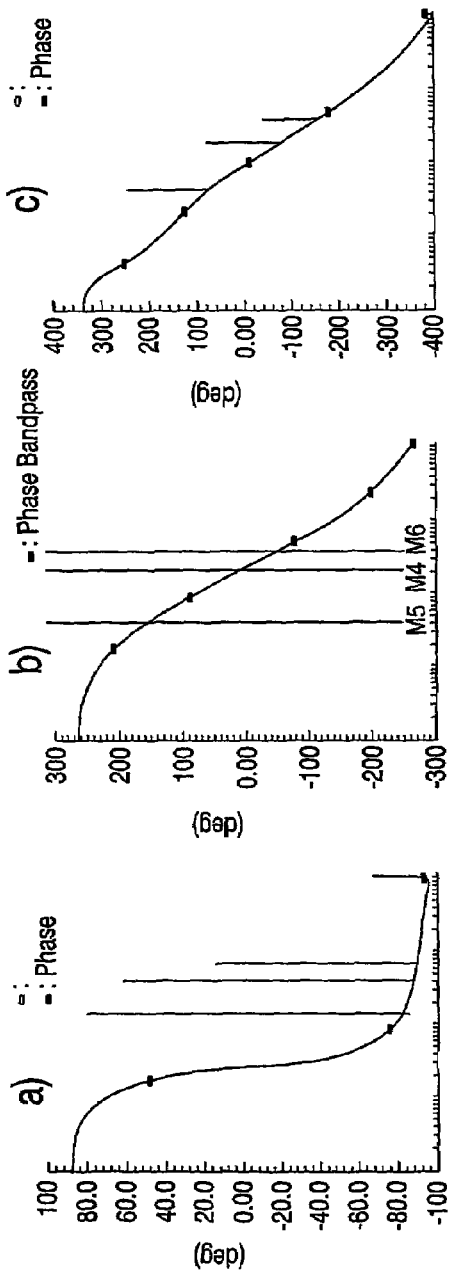
Figure 12:
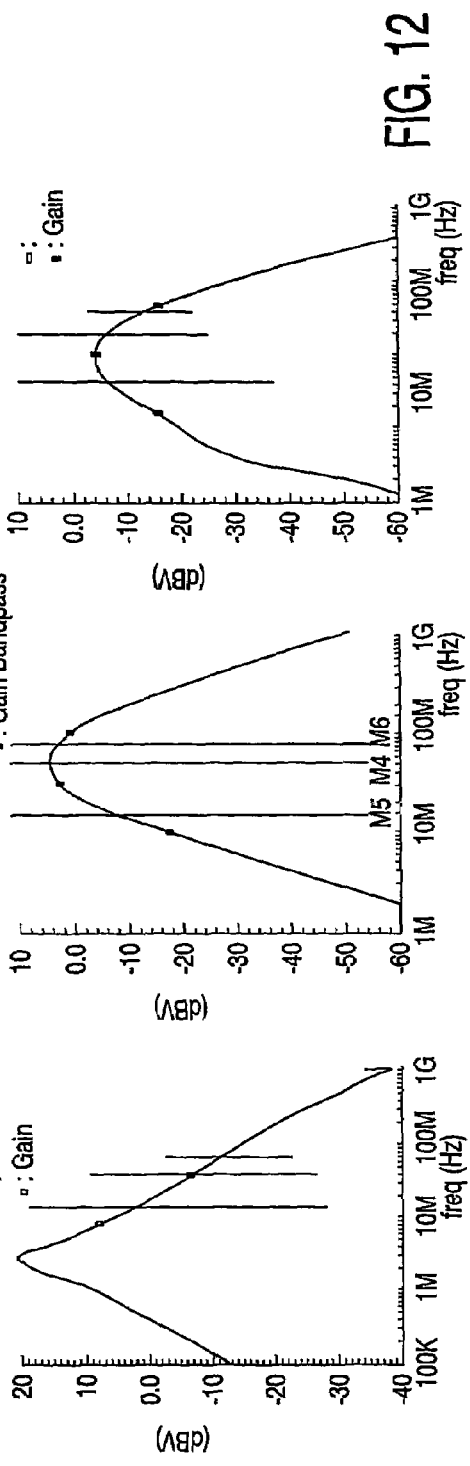

FIG. 12 shows diagrammatic representations as examples of a transfer function of an amplifier configuration, in particular in accordance with FIG. 8 or 9, with an overtone crystal and a bandpass filter configuration, in particular in accordance with FIG. 10 or 11, and shows an overall transfer function of an example of embodiment of an oscillator circuit formed by it on the occurrence of feedback from the bandpass filter configuration to the amplifier configuration.

Figure 3:
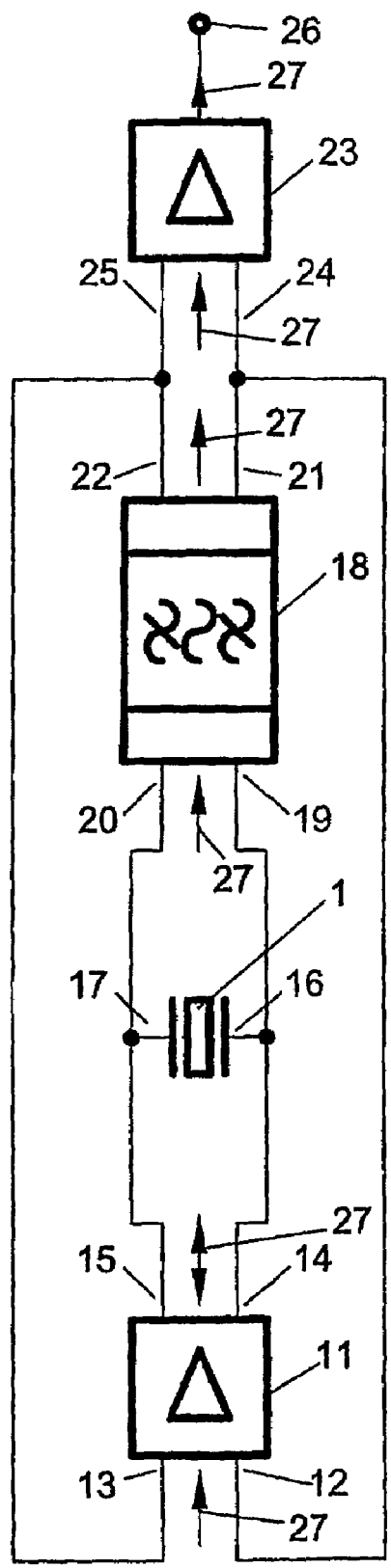
FIG. 3 shows a schematic circuit diagram of one example of embodiment of an oscillator circuit in accordance with the invention.
Figure 13:
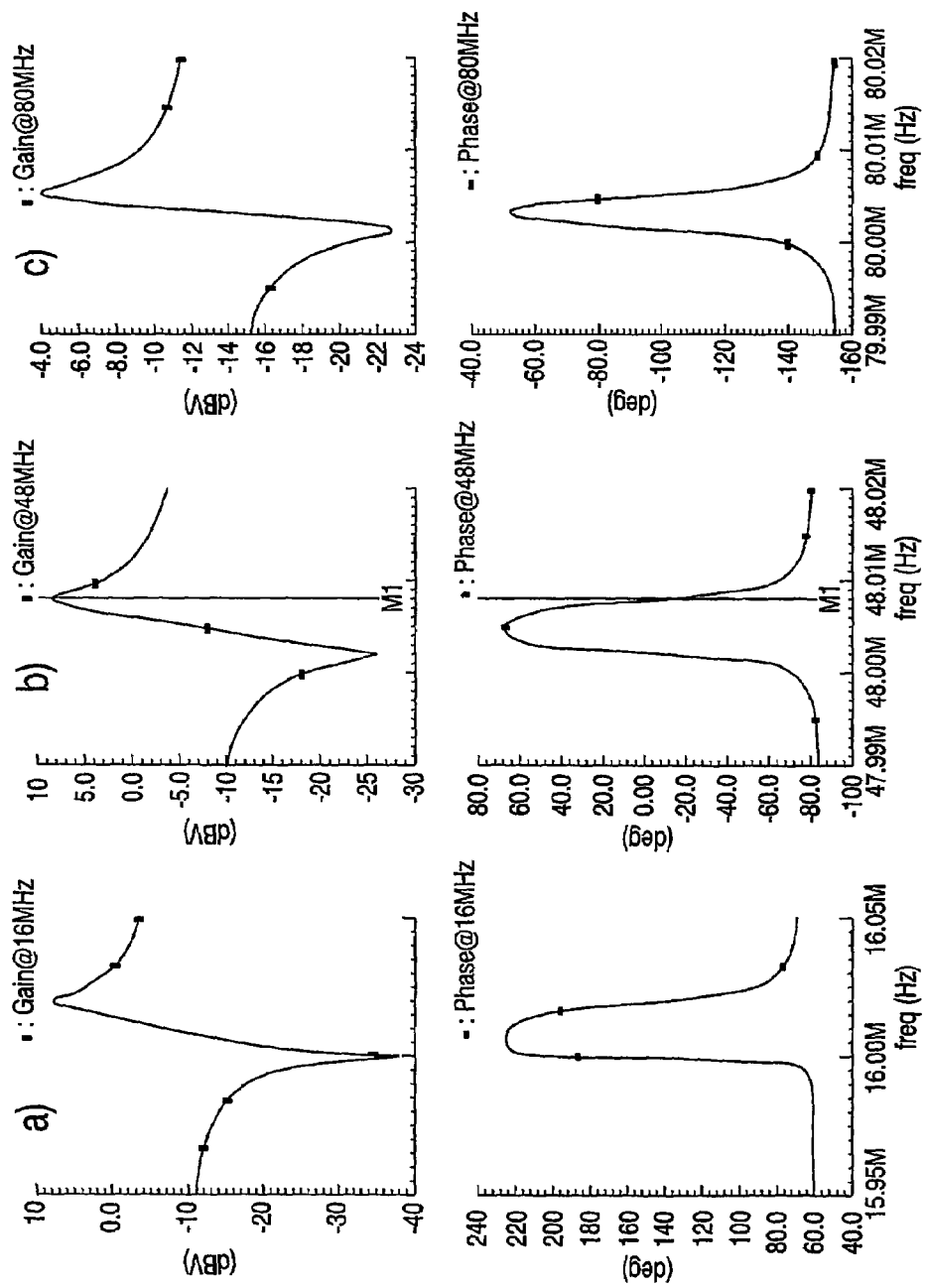

FIG. 13 shows diagrammatic representations as examples of an overall transfer function of an example of embodiment of an oscillator circuit in accordance with the invention as shown in FIG. 3, with an overtone crystal on the occurrence of feedback from the bandpass filter configuration to the amplifier configuration in detailed sections of the diagrammatic representations as shown in FIG. 12.

Figure 14:
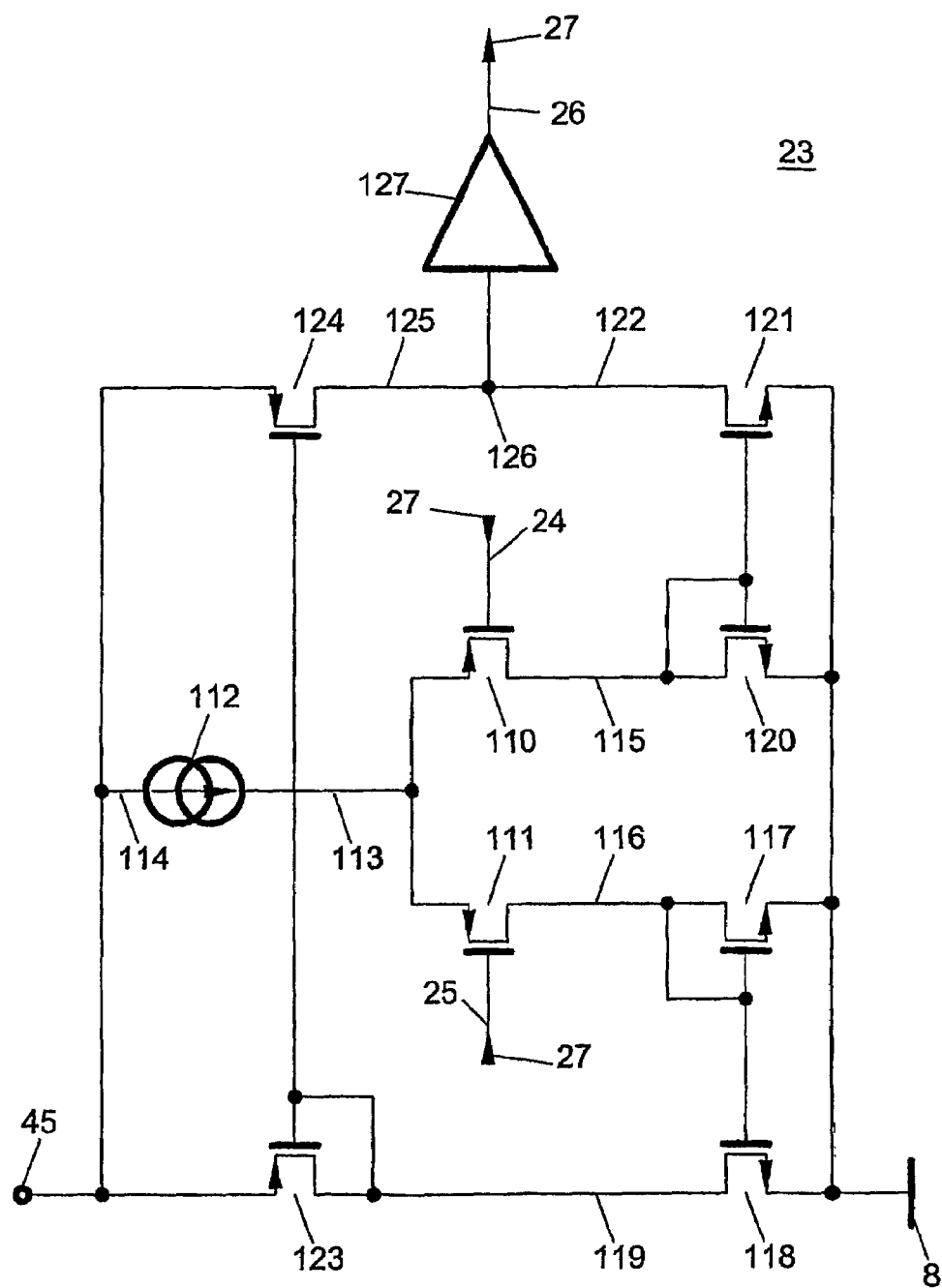

FIG. 14 shows a schematic circuit diagram of one example of embodiment of a simple converter circuit used in an oscillator circuit in accordance with the invention to convert a differential signal into an asymmetrically operated electromagnetic oscillation.

Figure 15:
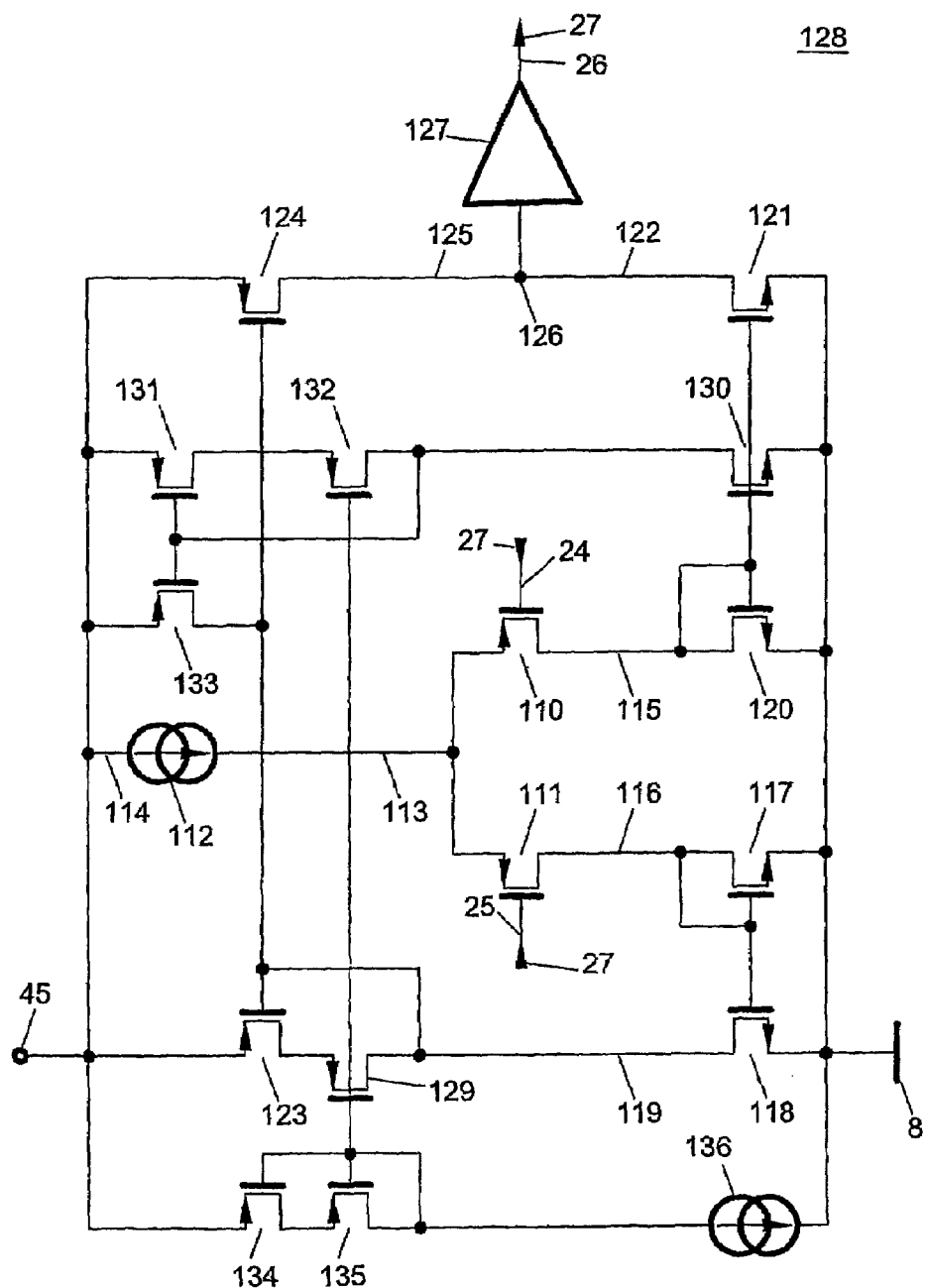

FIG. 15 shows a schematic circuit diagram of one example of embodiment of an improved converter circuit used in an oscillator circuit in accordance with the invention to convert a differential signal into an asymmetrically operated electromagnetic oscillation.

Corresponding elements are always provided with the same reference numbers herein.

Figure 1:
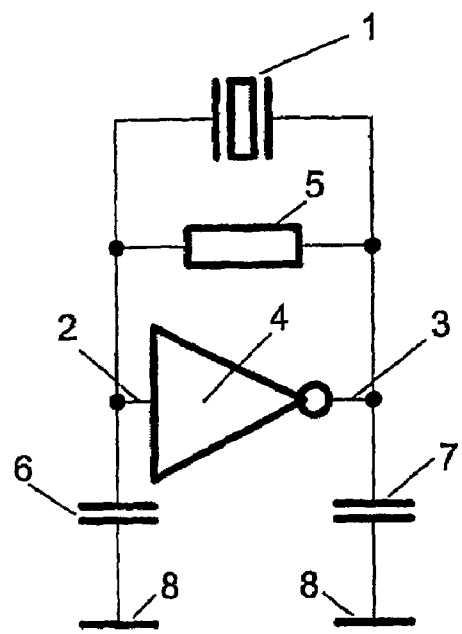
FIG. 1 shows the schematic circuit diagram of a crystal oscillator, in the form of a Pierce oscillator, for operation with the fundamental oscillation of the oscillator crystal.

In the schematic circuit diagram, in the form of an alternating current equivalent network diagram, of the Pierce oscillator in accordance with FIG. 1 in the form of a fundamental frequency oscillator with an oscillator crystal, the oscillator crystal is labeled with the reference number 1, and is connected, with each of its two terminals, to an input 2 and an output 3 of an inverting amplifier 4. Switched in parallel with the oscillator crystal 1 is a load resistor 5. The input 2 and the output 3 of the amplifier 4 are routed via two capacitors, 6 and 7 respectively, to a ground terminal 8.

In very general terms, an oscillatory system is characterized in that it has a feedback loop, the transfer function of which fulfills the "oscillation condition" when the loop is open, i.e. the sum of the transfer function is greater than or equal to 1 and its phase response equals a multiple of 360°. An undesirable resonant frequency in this oscillatory system can be suppressed in that, at this frequency, the sum of the transfer function is smaller than 1 and/or its phase response deviates from a multiple of 360°.

Figure 2:
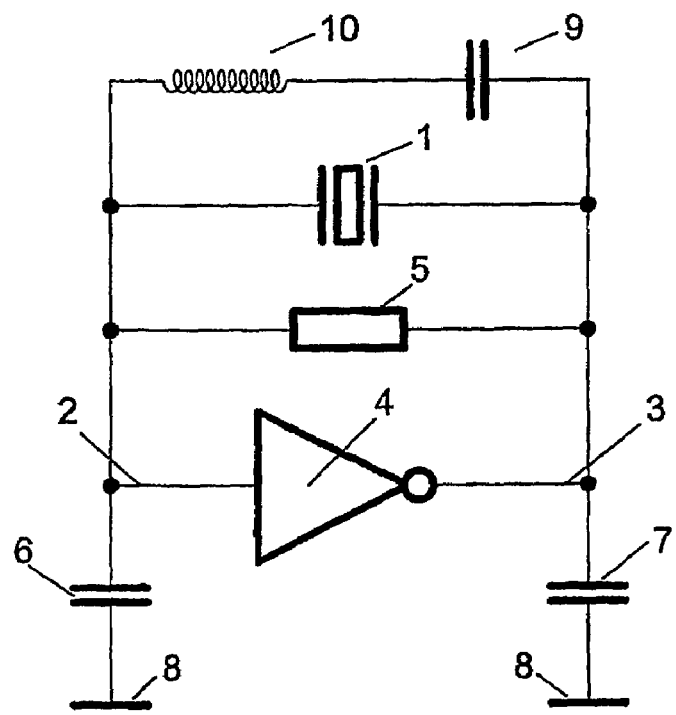
FIG. 2 shows the schematic circuit diagram of a crystal oscillator, in the form of a Pierce oscillator, for operation with a harmonic oscillation of the oscillator crystal and suppression of the fundamental oscillation.

FIG. 2 shows a modification of the Pierce oscillator in accordance with FIG. 1 for operation on a harmonic of the oscillator crystal 1. To this end, an LC series resonant circuit, formed from a series circuit of a resonant-circuit capacitor 9 and a resonant-circuit inductor 10, is externally switched in parallel with the oscillator crystal. The series resonant circuit 9, 10 is tuned to the fundamental oscillation of the oscillator crystal. As a result, this fundamental oscillation is short-circuited between the input 2 and the output 3 of the amplifier 4. Consequently, the sum of the transfer function is less than 1 at the frequency of this fundamental oscillation, and therefore the oscillation condition is not fulfilled.

As already stated above, strictly speaking, every unwanted resonant frequency of the oscillator crystal, but at least every one wherein the frequency is lower than the frequency of the desired harmonic of the oscillator crystal, and is therefore lower than the desired frequency of the oscillator, has to be attenuated by a separate LC series resonant circuit, i.e. during operation at, for example, the fifth harmonic of the oscillator crystal, the fundamental oscillation and the third harmonic each have to be attenuated by an appropriately tuned LC series resonant circuit. Therefore, only harmonic oscillators with suppression of the fundamental oscillation, which are operated on the third harmonic, are commonly encountered in practice, since the oscillators circuits would otherwise be too complex.

FIG. 3 shows, in a schematic form, a circuit diagram of one example of embodiment of an oscillator circuit in accordance with the invention. This comprises an amplifier configuration 11 with pairs of symmetrical inputs 12, 13 and outputs 14, 15, designated differential inputs and outputs. Connected to the pair of symmetrical outputs 14, 15 with its terminals 16, 17 is an oscillator crystal 1. A bandpass filter configuration 18 is connected, with a pair of symmetrical inputs 19, 20, to the terminals 16 and 17 respectively of the oscillator crystal 1 and to the pair of symmetrical outputs 14, 15 of the amplifier configuration 11. The bandpass filter configuration 18 is back-coupled, with a pair of symmetrical outputs 21, 22, to the pair of symmetrical inputs 12, 13 of the amplifier configuration 11, and the feedback loop of the oscillatory system is thereby closed. As a result of its design with differential inputs and outputs, the oscillator circuit is formed from the amplifier configuration 11, the oscillator crystal 1 and the bandpass filter configuration 18 for processing electromagnetic oscillations (known as differential signals), operated at least virtually symmetrically relative to a first reference potential. The first reference potential hereby corresponds to the direct-current operating point of the amplifier configuration 11 and, preferably, also to that of the bandpass filter configuration 18, and thereby that of the oscillator circuit as a whole.

In the oscillator circuit in accordance with FIG. 3, the amplifier configuration 11 is equipped with a transfer function, the frequency response of which depends on the properties of the connected oscillator crystal 1. The amplitude-frequency characteristic of the transfer function of the amplifier configuration 11 shows maxima in the range of the resonance frequencies of the oscillator crystal 1, since its impedance shows maxima here. By the dimensioning of the amplitude-frequency characteristic and/or of the phase-frequency characteristic of the bandpass filter configuration 18 as a function of the amplitude-frequency characteristic and the phase-frequency characteristic of the amplifier configuration 11 and of the oscillator crystal 1, it is achieved that the oscillation condition is fulfilled in the oscillator circuit for exclusively a selected harmonic of the oscillator crystal 1, and the high-frequency electromagnetic oscillation formed as a result of this selected harmonic of the oscillator crystal 1 is available at the outputs 21, 22 of the bandpass filter configuration 18. To put it another way, the bandpass filter configuration 18 is tuned to the selected harmonic of the oscillator crystal 1 and the gain factor (i.e. the amplitude-frequency characteristic) of the amplifier configuration 11 is dimensioned to be just large enough that, with an open loop, the sum of the transfer function of the amplifier configuration 11, the oscillator crystal 1 and the bandpass filter configuration 18 is greater than or equal to 1 only at the selected harmonic of the oscillator crystal. Moreover, at this selected harmonic of the oscillator crystal 1, the phase condition must be fulfilled. The oscillator circuit then oscillates precisely at the selected harmonic of the oscillator crystal 1.

In FIG. 3, an output signal of the oscillator circuit is tapped off from the outputs 21, 22 of the bandpass filter configuration 18 via a converter circuit 23, which serves for conversion of the differential signal emitted from these differential outputs 21, 22 into an electromagnetic oscillation operated asymmetrically relative to the direct-current operating point of the bandpass filter configuration 18. To this end, the pair of differential outputs 21, 22 of the bandpass filter configuration 18 is coupled with a pair of differential inputs, 24 and 25 respectively, of the converter circuit 23. The asymmetrically operated electromagnetic oscillation is emitted at one output 26 of the converter circuit 23. It may preferably take the form of a square-wave signal.

In FIG. 3, the arrows 27 indicate the direction of the signal flow in the oscillator circuit shown.

Figure 4:
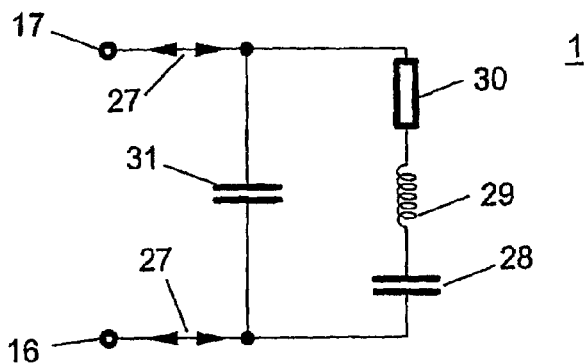
FIG. 4 shows an equivalent circuit diagram of a fundamental-frequency crystal.

For a more detailed explanation of the function of the amplifier configuration 11, let us briefly examine the equivalent network diagram of an oscillator crystal 1, as shown schematically in FIG. 4. According to this, the oscillator crystal represents an electrical two-terminal network, which comprises, in a manner that is known per se, a parallel circuit of a series resonant circuit comprising a capacitor 28, an inductor 29 and an ohmic resistor 30 on the one hand, and a terminal capacitor 31 on the other. The capacitor 28 and the inductor 29 are hereby determined by the mechanical properties of the oscillator crystal, the ohmic resistor is determined by its attenuation, and the terminal capacitor 31 by the size of the electrodes and leads. At the resonance of the series resonant circuit comprising the capacitor 28, the inductor 29 and the ohmic resistor 30, the oscillator crystal 1, measured between its terminals 16 and 17, possesses a very low impedance; at the so-called parallel resonance, lying at a slightly higher frequency, which is formed together with the terminal capacitor 31, the impedance rises considerably.

Figure 5:
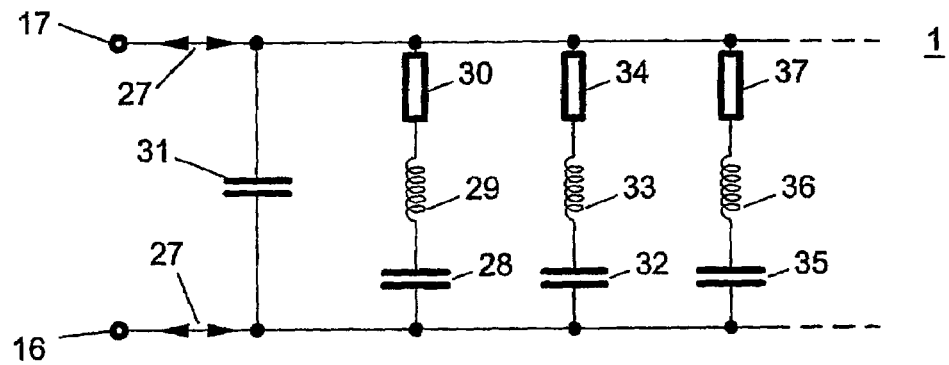
FIG. 5 shows an equivalent circuit diagram of an overtone crystal.

In the case of an oscillator crystal 1, which, in FIG. 5, takes the form of an overtone crystal, which possesses multiple resonance frequencies, this change in the sum of the impedance of the oscillator crystal 1 is also observable with every crystal overtone oscillation. FIG. 5 shows, in simplified form, an equivalent network diagram of an overtone crystal with supplementary elements for the third and the fifth harmonic in addition to the fundamental oscillation. In FIG. 5, a series circuit comprising a capacitor 32, an inductor 33 and an ohmic resistor 34 forms a series resonant circuit to represent the series resonance at the third harmonic; a series circuit comprising a capacitor 35, an inductor 36 and an ohmic resistor 37 forms a series resonant circuit to represent the series resonance at the fifth harmonic, etc.

Figure 6:
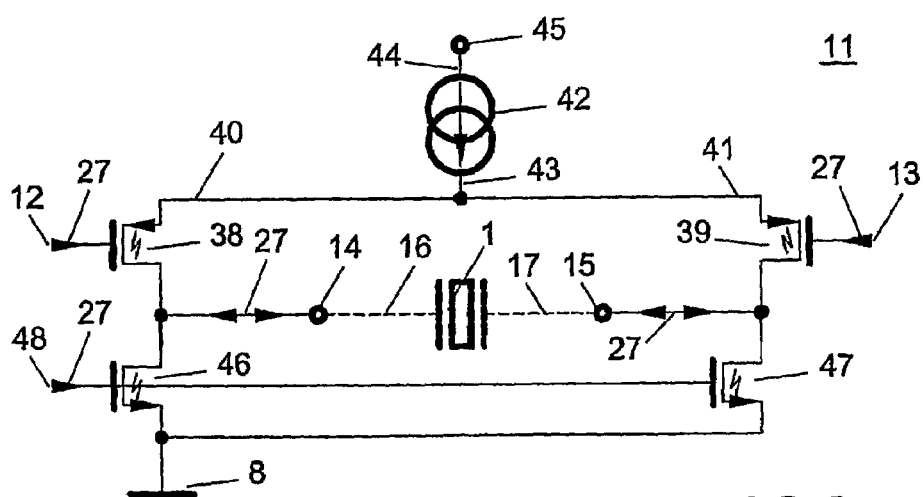
FIG. 6 shows a schematic circuit diagram of one example of embodiment of a simple amplifier configuration in an oscillator circuit in accordance with the invention.

This response of the oscillator crystal 1 is used in the amplifier configuration 11 described below in order to obtain an explicitly pronounced peak of the sum of the gain at every parallel resonance of the oscillator crystal 1. The schematic circuit diagram of one example of embodiment of an amplifier configuration 11 of this kind is shown in FIG. 6. This amplifier configuration 11 is equipped with a differential input stage, which comprises two field effect transistors 38 and 39, connected together at their source terminals 40 and 41 respectively, and connected to a first terminal 43 of a constant current source 42. A second terminal 44 of the constant current source 42 is connected to a supply-voltage terminal 45, at which a supply voltage, preferably forming a third reference potential, is delivered.

Gate terminals of the field effect transistors 38 and 39 form the first and second symmetrical (differential) inputs, 12 and 13 respectively, of the amplifier configuration 11. Drain terminals of the field effect transistors 38 and 39 form the first and second symmetrical (differential) inputs, 14 and 15 respectively, of the amplifier configuration 11, to connect the oscillator crystal 1, shown with broken lines, via its terminals, 16 and 17 respectively. These drain terminals, i.e. the outputs 14 and 15 respectively of the amplifier configuration 11, are further coupled, in each case via a load path, each of which comprises a field effect transistor, designated an output-load transistor 46 and 47, with a terminal carrying a second reference potential. The ground potential at ground terminal 8 is selected hereby as the second reference potential. A control voltage for setting load currents flowing in the output-load transistors 46 and 47 is supplied, via a common control voltage terminal 48, to gate terminals of the output-load transistors 46 and 47.

In FIGS. 4 to 6, the arrows 27 again indicate the direction of the signal flow in the circuits shown.

The loading of the field effect transistors 38 and 39 of the differential input stage of the amplifier configuration 11 is formed by the output load transistors 46 and 47 and the oscillator crystal 1. For low frequencies, this circuit possesses a high gain, determined by the transistor geometry, which steadily decreases from a cut-off frequency determined by the ohmic resistors of the output load transistors 46 and 47 and the terminal capacitor 31 of the oscillator crystal 1.

At each series resonance of the oscillator crystal 1, i.e. at every series resonance of one of the series resonant circuits for the fundamental oscillation or one of the harmonics in the equivalent network diagram as shown in FIG. 5, the gain of the combination comprising the amplifier configuration 11 and the oscillator crystal 1 declines sharply as a result of the breaking down of the sum of the impedance of the oscillator crystal 1 and then rises sharply at the high impedance of the following parallel resonance, which is formed together with the terminal capacitor 31. In the range of the parallel resonances, the terminal capacitor 31 hereby becomes ineffective, since it is part of the parallel resonant circuit formed by the oscillator crystal 1. The low-pass response formed from the terminal capacitor 31 of the oscillator crystal 1 and the ohmic resistors of the output load transistors 46 and 47 is overridden in the range of each parallel resonance.

Figure 7:
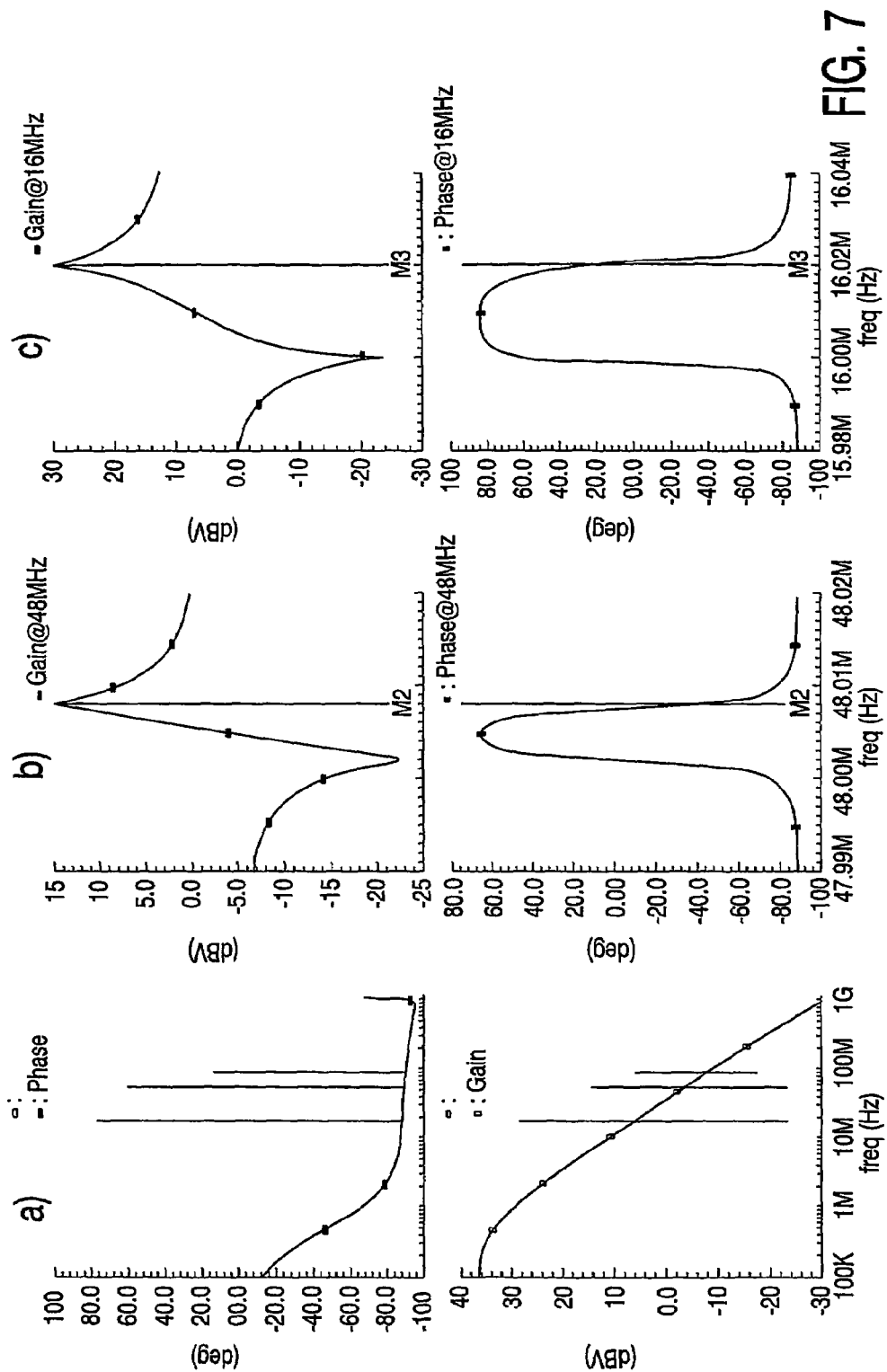
FIG. 7 shows diagrammatic representations of the transfer function of an amplifier configuration in accordance with FIG. 6 with an overtone crystal.

FIG. 7 shows diagrammatic representations of the transfer function of the amplifier configuration 11 as shown in FIG. 6 with an oscillator crystal 1 in the form of an overtone crystal. (This diagrammatic representation is referred to as "FIG. 8" in the heading for the part-diagrams a) to c) contained therein).

In the upper half of part-diagram a) in FIG. 7 is an example of a phase-frequency characteristic of the amplifier configuration 11 together with the oscillator crystal 1, which applies to an oscillator crystal with resonance frequencies lying at 16 MHz for the fundamental oscillation and at 48 MHz for the third harmonic. The phase (Phase) is plotted in degrees (deg) over the logarithmic frequency scale (freq) in Hertz (Hz) shown in the lower half of part-diagram a) in FIG. 7. The lower half of part-diagram a) in FIG. 7 shows an example of a corresponding amplitude-frequency characteristic of the amplifier configuration 11 together with the oscillator crystal 1, in which the gain (Gain) is plotted in dBV over the logarithmic frequency scale (freq) in Hertz (Hz).

In part-diagram b) of FIG. 7, a detail at 48 MHz is shown of the characteristics in part-diagram a) for the range around the third harmonic of the oscillator crystal 1 shown by way of example. The detail from the amplitude-frequency characteristic (Gain) is shown hereby in the upper half of part-diagram b) and the detail from the phase-frequency characteristic (Phase) in the lower half of part-diagram b).

In part-diagram c) of FIG. 7, a detail at 16 MHz is shown of the characteristics in part-diagram a) for the range around the fundamental oscillation of the oscillator crystal 1 shown by way of example. The detail from the amplitude-frequency characteristic (Gain) is shown hereby in the upper half of part-diagram c) and the detail from the phase-frequency characteristic (Phase) in the lower half of part-diagram c).

It can be seen from these diagrams that the low-pass response described appears outside the resonant ranges, which is also reflected in the phase response of the circuit. The phase lies outside the resonance points of the oscillator crystal 1 at −90°, rises to 0° at the series resonance and rises further up to a maximum of +90°, which, however, could be reached only theoretically with an infinitely high quality of the oscillator crystal 1, i.e. if the ohmic resistors 30, 34, 37 in the equivalent network diagram of the oscillator crystal 1 as shown in FIG. 4 or 5 become zero. This also means that a higher quality of the oscillator crystal 1 leads, within certain limits, to a higher gain. From this maximum above the series resonance, the value of the phase initially drops back to 0° at the frequency of the parallel resonance and subsequently drops further to the value of −90°, which is caused by the described low-pass response.

Of significance are the zero transitions of the phase-frequency characteristic of the interconnection comprising the amplifier configuration 11 and oscillator crystal 1, since one of the two necessary part-conditions of the oscillation condition is fulfilled here. In the case of a zero transition of the phase-frequency characteristic at a series resonance, an especially low gain of said interconnection is produced, and, with a zero transition of the phase-frequency characteristic at a parallel resonance, an especially high gain. As can be seen from the behavior of the amplitude-frequency characteristic (Gain) shown in FIG. 7, part-diagrams a) and b), the oscillation condition would be fulfilled with direct back-coupling of the signal at the outputs 14, 15 of the amplifier configuration 11 to its inputs 12, 13, both at the fundamental oscillation of the oscillator crystal 1 and at its third harmonic. The frequencies for which this applies are marked in part-diagrams b) and c) with markers M2 and M3 respectively.

FIG. 8 shows a schematic circuit diagram of one example of embodiment of an amplifier configuration 49, improved relative to the circuit diagram shown in FIG. 6, for use in an oscillator circuit in accordance with the invention. It shows an addition to the schematic circuit diagram of the amplifier configuration 11 as shown in FIG. 6, comprising a control-voltage generation stage 50, an operating-point regulating stage 51 and an offset compensation device 52. In the improved amplifier configuration 49 as shown in FIG. 8, the elements known from FIG. 6 are again provided with the same reference numbers.

The control-voltage generation stage 50 in the improved amplifier configuration 49 serves to generate a control voltage, which is supplied, via the common control-voltage terminal 48, to the gate terminals of the output load transistors 46 and 47 for setting load currents flowing in the output load transistors 46 and 47. To this end, the control-voltage generation stage 50 comprises a series circuit comprising a constant current source 54 and a field effect transistor 55, bridged between its drain and gate terminals. The source terminal of this field effect transistor 55, bridged between its drain and gate terminals, is connected via the drain-source path of a further field effect transistor 56, to the ground terminal 8. A smoothing capacitor 57 is inserted between the gate terminal of the field effect transistor 55, bridged between its drain and gate terminals, and the ground terminal 8. In addition, the further field effect transistor 56 of the control-voltage generation stage 50 is connected, with its gate terminal, to the drain terminal of the field effect transistor 55, bridged between its drain and gate terminals. A terminal 53 of the constant current source 54, facing away from the field effect transistors 55, 56, is connected to the supply-voltage terminal 45.

In the example of embodiment shown in FIG. 8, the further field effect transistor 56 of the control-voltage generation stage 50 is simultaneously a component of the operating-point regulating stage 51. This further comprises a first field effect transistor 58, the drain-source path of which is series-connected in the first load path with the output load transistor 46 located there, and a second field effect transistor 59, the drain-source path of which is series-connected in the second load path with the output load transistor 47 located there. A gate terminal of the first field effect transistor 58 of the operating-point regulating stage 51 is connected to the first differential output 14 of the amplifier configuration 49. A gate terminal of the second field effect transistor 59 of the operating-point regulating stage 51 is connected to the second differential output 15 of the amplifier configuration 49. The first and second field effect transistors 58, 59 of the operating-point regulating stage 51 are connected, with their source terminals, to the ground terminal 8, which carries the ground potential as the second reference potential. The operating-point regulating stage 51 actuates a regulation of the direct-current operating point of the voltage at the differential outputs 14, 15 of the amplifier configuration 49.

In the example of embodiment shown in FIG. 8, the offset compensation device 52 comprises a first high-pass circuit comprising an ohmic resistor 60 and a capacitor 61. This first high-pass circuit 60, 61 is inserted between the first differential input 12 of the amplifier configuration 49, the gate terminal of the first field effect transistor 38 of the differential amplifier circuit comprising the amplifier configuration 49, which is coupled with the first differential input 12 (and is also designated the differential input stage of the amplifier configuration 49), and the differential output 14 formed by the drain terminal of this first field effect transistor 38. The offset compensation device 52 further comprises a second high-pass circuit comprising an ohmic resistor 62 and a capacitor 63. This second high-pass circuit 62, 63 is inserted between the second differential input 13 of the amplifier configuration 49, the gate terminal of the second field effect transistor 39 of the differential input stage of the amplifier configuration 49, which is coupled with the second differential input 13, and the differential output 15 formed by the drain terminal of this second field effect transistor 39. The limiting frequencies of the first high-pass circuit 60, 61 and of the second high-pass circuit 62, 63 are small compared with the frequency operating range of the oscillator circuit, and therefore do not contribute to a phase shift in the environment of the frequency of the selected harmonic of the oscillator crystal 1.

By virtue of the at least theoretically complete symmetry of the differential circuit configuration of the oscillator circuit, a build-up occurs only as a result of thermal noise or asymmetrical interference introduced externally at the terminals 16, 17 of the oscillator crystal 1. A significant reduction in the build-up duration can be achieved by means of an expansion of the amplifier configuration 49 used in the oscillator circuit in accordance with the invention, as shown in FIG. 9.

FIG. 9 shows a schematic circuit diagram of one example of embodiment of an amplifier configuration 64, improved relative to the circuit diagram shown in FIG. 8, for use in an oscillator circuit in accordance with the invention. It shows an addition to the schematic circuit diagram of the amplifier configuration 49 as shown in FIG. 8, comprising an auxiliary starting circuit 65. In the improved amplifier configuration 64 as shown in FIG. 9, the elements already described with reference to FIG. 8 are provided with the same reference numbers.

In accordance with the example of embodiment in accordance with FIG. 9, the auxiliary starting circuit 65 comprises a first field effect transistor 66, a second field effect transistor 67, a start-signal input 68 and a delay stage 69. The first field effect transistor 66 of the auxiliary starting circuit 65 is disposed between the gate terminal of the first field effect transistor 38 of the differential input stage of the amplifier configuration 64 and a terminal carrying a third reference potential. This terminal carrying the third reference potential is formed in FIG. 9 by the supply-voltage terminal 45 carrying the supply voltage. The second field effect transistor 67 of the auxiliary starting circuit 65 is disposed between the gate terminal of the second field effect transistor 39 of the differential input stage of the amplifier configuration 64 and the supply-voltage terminal 45. The start-signal input 68 is coupled directly with a gate terminal of the first field effect transistor 66 of the auxiliary starting circuit 65, and, via the delay stage 69, with a gate terminal of the second field effect transistor 67 of the auxiliary starting circuit 65.

When the oscillator circuit is put into operation, an at least largely pulse-shaped or step-shaped start signal is applied to the start-signal input 68 from outside. This start signal is supplied directly to the gate terminal of the first field effect transistor 66 of the auxiliary starting circuit 65, and, with a time delay, to the gate terminal of the second field effect transistor 67 of the auxiliary starting circuit 65. As a result, during a predetermined period when the oscillator circuit is put into operation, a differential voltage is supplied to the gate terminals of the field effect transistors 38, 39 of the differential input stage of the amplifier configuration 64, as a result of which a time-limited interference is deliberately introduced and the symmetry predetermined by the differential oscillator circuit is thus briefly overridden.

FIG. 10 shows an example of embodiment of a bandpass filter configuration 18 in an oscillator circuit in accordance with the invention with a cascade connection of three bandpass stages 70, 71 and 72, which are disposed between the symmetrical inputs 19, 20 and the symmetrical outputs 21, 22 of the bandpass filter configuration 18. The purpose of the bandpass filter configuration 18 is to select only the desired resonant frequency from all the resonance frequencies of the oscillator crystal 1 for which the oscillation condition is fulfilled in the interconnection of the oscillator crystal 1 with the amplifier configuration 11, 49 and 64, and to suppress all unwanted resonance frequencies. Through the dimensioning of the amplitude-frequency characteristic and/or the phase-frequency characteristic of the bandpass filter configuration 18 as a function of the amplitude-frequency characteristic and the phase-frequency characteristic of the amplifier configuration 11, 49 and 64, and of the oscillator crystal 1, the oscillation condition for the oscillator circuit as a whole, i.e. the phase and/or gain condition for an oscillation, is to be fulfilled thereby exclusively for a selected harmonic of the oscillator crystal, and its fulfillment is to be prevented for the unwanted resonance frequencies. The harmonic of the oscillator crystal 1 selected in this manner forms a high-frequency electromagnetic oscillation, which is available at the output of the bandpass filter configuration 18.

The three-stage design of the bandpass filter configuration 18 as shown in FIG. 10 enables the individual bandpass stages 70, 71 and 72 to be designed with lower quality than if the bandpass filter configuration 18 were designed with one single bandpass stage. It can thereby be achieved that the power consumption of all three bandpass stages 70, 71 and 72 together, and thereby of the bandpass filter configuration 18 as a whole, can be kept lower than in the case of a design of the bandpass filter configuration 18 with one single bandpass stage of high quality. With this design of the bandpass stages 70, 71 and 72, however, the fulfillment of the oscillation condition will be prevented principally by the phase-frequency characteristic of the bandpass filter configuration 18; i.e. the phase condition for an oscillation of the oscillator circuit is fulfilled only in the range of the selected harmonic of the oscillator crystal 1, and not at the remaining resonance frequencies of the amplifier configuration 11, 49 and 64 and of the oscillator crystal 1. On the other hand, the amplitude-frequency characteristic of the bandpass filter configuration 18 designed in this way only exhibits, over the frequency, a change so small that the gain condition for an oscillation of the oscillator circuit can still be fulfilled in the range of the resonance frequencies of the amplifier configuration 11, 49 and 64 and of the oscillator crystal 1 that are adjacent to the selected harmonic of the oscillator crystal 1. So the amplitude-frequency characteristic of the bandpass filter configuration 18 designed in this way would not suffice per se for a frequency selection.

In the bandpass filter configuration 18 in accordance with FIG. 10, the first bandpass stage 70 is equipped with a first symmetrical input 73, a second symmetrical input 74, a first symmetrical output 75 and a second symmetrical output 76. The second bandpass stage 71 is equipped with a first symmetrical input 77, a second symmetrical input 78, a first symmetrical output 79 and a second symmetrical output 80. The third bandpass stage 72 is equipped with a first symmetrical input 81, a second symmetrical input 82, a first symmetrical output 83 and a second symmetrical output 84.

The first differential (or symmetrical) input 73 of the first bandpass stage 70 forms the first symmetrical input 19 of the bandpass filter configuration 18. The second differential (or symmetrical) input 74 of the first bandpass stage 70 forms the second symmetrical input 20 of the bandpass filter configuration 18. The first symmetrical output 75 of the first bandpass stage 70 is connected to the first symmetrical input 77 of the second bandpass stage 71 in a first junction point 85. The second symmetrical output 76 of the first bandpass stage 70 is connected to the second symmetrical input 78 of the second bandpass stage 71 in a second junction point 86. The first symmetrical output 79 of the second bandpass stage 71 is connected to the first symmetrical input 81 of the third bandpass stage 72 in a third junction point 87. The second symmetrical output 80 of the second bandpass stage 71 is connected to the second symmetrical input 82 of the third bandpass stage 72 in a fourth junction point 88. The first differential (or symmetrical) output 83 of the third bandpass stage 72 forms the first symmetrical output 21 of the bandpass filter configuration 18. The second differential (or symmetrical) output 84 of the third bandpass stage 72 forms the second symmetrical output 22 of the bandpass filter configuration 18.

Arrows 27 again indicate the direction of the signal flow in the circuits shown.

FIG. 11 shows the first bandpass stage 70 as an example of embodiment of a bandpass stage from the example of embodiment of the bandpass filter configuration 18 in accordance with FIG. 10. This bandpass stage 70 comprises a differential amplifier circuit comprising a first field effect transistor 89 and a second field effect transistor 90, which are coupled together by linking their source terminals to one another and further coupled at this link to a first terminal 91 of a first constant current source 92. A second terminal 93 of the first constant current source 92 is linked to the supply-voltage terminal 45. A drain terminal of the first field effect transistor 89 of the first bandpass stage 70 forms the second output 76 of the first bandpass stage 70. A drain terminal of the second field effect transistor 90 of the first bandpass stage 70 forms the first output 75 of the first bandpass stage 70.

In the first bandpass stage 70, the first differential input 73 is coupled, via a first high-pass circuit, to a gate terminal of the first field effect transistor 89. This first high-pass circuit comprises a first high-pass capacitor 94, via which the first differential input 73 is coupled with the gate terminal of the first field effect transistor 89, and a first high-pass resistor 95, which is connected with a first terminal 96 to the gate terminal of the first field effect transistor 89. The second differential input 74 is further coupled, via a second high-pass circuit, to a gate terminal of the second field effect transistor 90. This second high-pass circuit comprises a second high-pass capacitor 97, via which the second differential input 74 is coupled with the gate terminal of the second field effect transistor 90, and a second high-pass resistor 98, which is connected with a first terminal 99 to the gate terminal of the first field effect transistor 90. The first high-pass resistor 95 and the second high-pass resistor 98 are connected to one another at their second terminals 100 and 101 respectively, and to an output terminal 102 of a direct-bias-voltage generation stage 103. The direct-bias-voltage generation stage 103 of the first bandpass stage 70 comprises a second constant current source 104, connected in series with a third field effect transistor 105, which is short-circuited between its gate terminal and its drain terminal, wherein this series circuit is disposed between the supply-voltage terminal 45 and the ground terminal 8. The connection of the gate terminal and the drain terminal of the third field effect transistor 105 hereby forms the output terminal 102 of the direct-bias-voltage generation stage 103 in order to supply a direct bias voltage for the high-pass circuits.

In the first bandpass stage 70 as shown in FIG. 11, the drain terminal of the first field effect transistor 89, which forms the second output 76, is further connected, via a first low-pass circuit, to the ground terminal 8, which forms a terminal carrying a fifth reference potential (here: ground potential). The drain terminal of the second field effect transistor 90, which forms the first output 75 of the first bandpass stage 70, is connected, via a second low-pass circuit, to the ground terminal 8. The first low-pass circuit comprises a parallel circuit comprising a first low-pass capacitor 106 and a first low-pass resistor 107, and the second low-pass circuit comprises a parallel circuit comprising a second low-pass capacitor 108 and a second low-pass resistor 109. The low-pass circuits form the output loads for the differential amplifier circuit comprising the first field effect transistor 89 and the second field effect transistor 90 of the bandpass stage 70.

The low-pass capacitors 106, 108 do not necessarily have to be present as explicit components in the first bandpass stage 70—and also the remaining bandpass stages—but may also take the form of parasitic capacitances of the low-pass resistors 107, 109, or input impedances of downstream circuit stages connected to the outputs 75, 76 of the first bandpass stage 70—e.g. the second bandpass stage 71 in this example.

Owing to the fact that the high-pass circuits and low-pass circuits take the form of RC networks, they can readily be combined with the remaining semiconductor elements of the oscillator circuit on a semiconductor base in integrated semiconductor technology.

FIG. 12 shows diagrammatic representations as examples of a transfer function of an amplifier configuration 49 and 64, in particular in accordance with FIG. 8 or 9, with an oscillator crystal 1 in the form of an overtone crystal, and a bandpass filter configuration 18, in particular in accordance with FIG. 10 or 11, and shows an overall transfer function of an example of embodiment of an oscillator circuit formed by it on the occurrence of feedback from the bandpass filter configuration 18 to the amplifier configuration 49 and 64. (This diagrammatic representation is designated "FIG. 12" in the heading to the part-diagrams a) to c) contained therein).

In the upper half of part-diagram a) in FIG. 12 is an example of a phase-frequency characteristic of the amplifier configuration 49 and 64 together with the oscillator crystal 1, which applies to an oscillator crystal 1 with resonance frequencies lying at 16 MHz for the fundamental oscillation and at 48 MHz for the third harmonic. The phase (Phase) is plotted in degrees (deg) over the logarithmic frequency scale (freq) in Hertz (Hz) shown in the lower half of part-diagram a) in FIG. 12. The lower half of part-diagram a) in FIG. 12 shows an example of a corresponding amplitude-frequency characteristic of the amplifier configuration 49 and 64 together with the oscillator crystal 1, in which the gain (Gain) is plotted in dBV over the logarithmic frequency scale (freq) in Hertz (Hz). Clearly recognizable, in particular in the amplitude-frequency characteristic in the lower half of part-diagram a), is the high-pass characteristic of the offset compensation device 52 in the amplifier configuration 49 and 64.

In the upper half of part-diagram b) in FIG. 12 is an example of a phase-frequency characteristic of the bandpass filter configuration 18, which is designed for an oscillator crystal 1 dimensioned as indicated in part-diagram a). Plotted here again is the phase (Phase Bandpass) in degrees (deg) over the logarithmic frequency scale (freq) in Hertz (Hz) shown in the lower half of part-diagram b) in FIG. 12. The lower half of part-diagram b) in FIG. 12 shows an example of a corresponding amplitude-frequency characteristic of the bandpass filter configuration 18, in which the gain (Gain Bandpass) is plotted in dBV over the logarithmic frequency scale (freq) in Hertz (Hz). It is clearly recognizable in the amplitude-frequency characteristic in the lower half of part-diagram b), that the attenuation of the amplifier configuration 49 and 64 by the bandpass filter configuration 18 is inadequate, either for the fundamental oscillation of the oscillator crystal 1 or for its fifth harmonic, to prevent the fulfillment of the gain condition as part of the oscillation condition. Conversely, the phase response, i.e. the phase-frequency characteristic, of the bandpass filter configuration 18 shows the property that is both desired and required for prevention of the fulfillment of the phase condition as part of the oscillation condition, in that, at the frequency of the fundamental oscillation of the oscillator crystal 1, the phase is considerably greater than 90°, at the frequency of the third harmonic of the oscillator crystal 1 it is around 0°, and at the frequency of the fifth harmonic of the oscillator crystal 1, it is sufficiently close to −90°. To make this clearer, the frequencies to which this applies are marked, in both halves of part-diagram b), with the markers M4 for the third harmonic, M5 for the fundamental oscillation and M6 for the fifth harmonic.

Part-diagram c) in FIG. 12 shows, for the above-explained dimensioning examples, the phase-frequency characteristic (Phase) in the upper half and, in the lower half, the corresponding amplitude-frequency characteristic (Gain) of the amplifier configuration 49 and 64 together with the oscillator crystal 1 and the bandpass filter configuration 18 with an open feedback loop, again plotted in degrees (deg) and in dBV over the logarithmic frequency scale (freq) in Hertz (Hz) plotted in the lower half of part-diagram c) in FIG. 12.

FIG. 13 shows diagrammatic representations of an overall transfer function of the above-explained dimensioning examples of the oscillator circuit in accordance with the invention as shown in FIG. 3, with an oscillator crystal 1 in the form of an overtone crystal on the occurrence of feedback from the bandpass filter configuration 18 to the amplifier configuration 49 and 64 in detailed sections of the diagrammatic representations as shown in FIG. 12. (This diagrammatic representation is designated "FIG. 13" in the heading to the part-diagrams a) to c) contained therein). In part-diagram a) of FIG. 13, a detail at 16 MHz is shown of the overall transfer function from part-diagram c) in FIG. 12 for the range around the fundamental oscillation of the oscillator crystal 1 shown by way of example. Part-diagram b) of FIG. 13 shows a detail at 48 MHz of the overall transfer function in part-diagram c) of FIG. 12 for the range around the third harmonic of the oscillator crystal 1 shown by way of example, and part-diagram c) of FIG. 13 shows a detail at 80 MHz of the overall transfer function from part-diagram c) in FIG. 12 for the range around the fifth harmonic of this oscillator crystal 1. The detail from the amplitude-frequency characteristic (Gain) is shown hereby in the upper half of part-diagrams a), b), c) and the detail from the phase-frequency characteristic (Phase) in the lower half of part-diagrams a), b) c). The gain (Gain) is again plotted in dBV and the phase (Phase) in degrees (deg) over the logarithmic frequency scales (freq) in Hertz (Hz) in the lower halves of part-diagrams a), b), c) in FIG. 12.

It is apparent, in particular from the diagrammatic details shown in FIG. 13, that, by virtue of the connection of the bandpass filter configuration 18 downstream of the amplifier configuration 49 and 64, both the gain condition and the phase condition for an oscillation are fulfilled only at the desired third harmonic, which is indicated in part-diagram b) of FIG. 13 with marker M1, and not at the fundamental oscillation in accordance with part-diagram a) of FIG. 13 or at the fifth harmonic in accordance with part-diagram c) of FIG. 13.

FIG. 14 shows a schematic circuit diagram of one example of embodiment of a simple converter circuit 23 used in an oscillator circuit in accordance with the invention to convert a differential signal into an electromagnetic oscillation that is operated asymmetrically relative to the direct-current operating point of the bandpass filter configuration 18, and thereby preferably relative to that of the oscillator circuit as a whole.

To this end, the converter circuit 23 in accordance with FIG. 14 contains an input stage, in the form of a differential amplifier with field effect transistors 110 and 111 coupled at their source terminals, to which the differential signal to be converted is supplied from the symmetrical outputs 21, 22 of the bandpass filter configuration 18 via gate terminals f the field effect transistors 110 and 111. The gate terminal of the first field effect transistor 110 hereby forms the first differential input 24 of the converter circuit 23, and the gate terminal of the second field effect transistor 111 forms the second differential input 25 of the converter circuit 23. A first constant current source 112 of the converter circuit 23 is connected, with its first terminal 113, to the junction point of the source terminals of the field effect transistors 110 and 111, and, with its second terminal 114, to the supply-voltage terminal 45. A drain terminal of the second field effect transistor 111 forms a first output terminal 116 of the input stage of the converter circuit 23 to supply a first differential output signal of the input stage of the converter circuit 23. A drain terminal of the first field effect transistor 110 forms a second output terminal 115 of the input stage of the converter circuit 23 to supply a second differential output signal of the input stage of the converter circuit 23.

The converter circuit 23 further comprises a first current mirror stage to mirror the first differential output signal at the first output terminal 116 of the input stage of the converter circuit 23 into a first intermediate signal. This first current mirror stage comprises a first and a second field effect transistor 117 and 118, which are coupled via their gate terminals. The first field effect transistor 117 of the first current mirror stage hereby forms its input transistor, and is short-circuited between its drain and gate terminals. The source terminals of the field effect transistors 117, 118 are supplied jointly to the ground terminal 8. A drain terminal of the second field effect transistor 118 forms an output terminal 119 of the first current mirror stage 117, 118 of the converter circuit 23, at which the first intermediate signal is supplied.

The converter circuit 23 further comprises a second current mirror stage to mirror the second differential output signal at the second output terminal 115 of the input stage of the converter circuit 23 into a second intermediate signal. This second current mirror stage comprises a first and a second field effect transistor 120 and 121, which are coupled via their gate terminals. The first field effect transistor 120 of the second current mirror stage hereby forms its input transistor, and is short-circuited between its drain and gate terminals. The source terminals of the field effect transistors 120, 121 are supplied jointly to the ground terminal 8. A drain terminal of the second field effect transistor 121 forms an output terminal 122 of the second current mirror stage 120, 121 of the converter circuit 23, at which the second intermediate signal is supplied.

The converter circuit 23 further comprises a third current mirror stage to mirror the first intermediate signal at the first output terminal 119 of the first current mirror stage 117, 118 of the converter circuit 23 into a third intermediate signal. This third current mirror stage comprises a first and a second field effect transistor 123 and 124, which are coupled via their gate terminals. The first field effect transistor 123 of the third current mirror stage hereby forms its input transistor, and is short-circuited between its drain and gate terminals. The source terminals of the field effect transistors 123, 124 of the third current mirror stage are supplied jointly to the supply-voltage terminal 45. A drain terminal of the second field effect transistor 124 forms an output terminal 125 of the third current mirror stage 123, 124 of the converter circuit 23, at which the third intermediate signal is supplied.

Finally, the converter circuit 23 comprises a subtraction circuit to subtract the second intermediate signal from the third intermediate signal, which takes the form of a current node 126 between the output terminal 122 of the second current mirror stage 120, 121 and the output terminal 125 of the third current mirror stage 123, 124 of the converter circuit 23. This current node 126 is coupled, via an output driver circuit 127, with the output 26 of the converter circuit 23, to amplify and supply the electromagnetic oscillation that is operated asymmetrically relative to the direct-current operating point.

With a sufficiently high gain of the differential input signal supplied to it, the converter circuit 23 shown in FIG. 14 brings about its conversion into an at least largely square-wave signal, switching between two voltage potentials determined by the design with field effect transistors, which is also designated a "digital, asymmetrically operated signal with CMOS levels", provided the field effect transistors used are of the CMOS type.

It transpires, however, that in the case of this circuit, the junction point of the gate terminals of the field effect transistors 123 and 124 of the third current mirror stage has only a relatively low voltage swing in operation. This voltage swing is restricted towards high voltage potentials by the threshold voltage of the first field effect transistor 123. Towards low voltage potentials, the voltage swing is restricted by the design of this first field effect transistor 123 and the highest possible value of the current through the second field effect transistor 118 of the first current mirror stage of the converter circuit 23. This highest possible value of the current through the second field effect transistor 118 of the first current mirror stage of the converter circuit 23 arises when the voltage potential at the second differential input 25 of the converter circuit 23 assumes its most negative possible value, and simultaneously the voltage potential at the first differential input 24 of the converter circuit 23 assumes its most positive value.

By virtue of the fact that the described voltage swing at the junction point of the gate terminals of the field effect transistors 123 and 124 of the third current mirror stage of the converter circuit 23 is subject to relatively narrow restriction, the second field effect transistor 124 is de-energized only slowly and incompletely at the highest possible voltage potential at the junction point of the gate terminals of the field effect transistors 123 and 124 of the third current mirror stage, so the current forming the second intermediate signal, which discharges the current node 126 of the converter circuit 23 when the difference between the voltage potential at the second differential input 25 and the voltage potential at the first differential input 24 of the converter circuit 23 is tending to positive, operates only with a delay, and not immediately, on a high input impedance of the second field effect transistor 124 of the third current mirror stage of the converter circuit 23. Correspondingly, this current, which forms the second intermediate signal, undertakes not only the recharging of the current node 126, but also a proportion of this current flows as a cross current through said second field effect transistor 124. As a result, the discharging of the current node 126 is retarded.

When the difference between the voltage potential at the second differential input 25 and the voltage potential at the first differential input 24 of the converter circuit 23 is tending to become positive, the voltage swing at the junction point of the gate terminals of the field effect transistors 123 and 124 of the third current mirror stage, which is restricted towards low voltage potentials, leads to the situation where the second field effect transistor 124 is energized only with a delay and not instantaneously, and with the lowest possible voltage potential at its gate terminal, so this second field effect transistor 124 charges the current node 126 only at decelerated speed.

The procedures described lead to the situation where the edge steepness of the signal at the current node 126, and thereby the edge steepness of the electromagnetic oscillation delivered at the output 26 of the converter circuit 23, which is intended to form an at least largely square-wave signal, turns out to be relatively small. It transpires that this relatively small edge steepness contributes to the fact that the above-mentioned interference leads to increased "jitter" of the electromagnetic oscillation delivered at the output 26 of the converter circuit 23.

FIG. 15 shows a schematic circuit diagram of one example of embodiment of a converter circuit 128, which is improved relative to the converter circuit 23 in accordance with FIG. 14 and is used in an oscillator circuit in accordance with the invention to convert a differential signal into an asymmetrically operated electromagnetic oscillation. The elements described in FIG. 14 are again provided with the same reference numbers.

In the improved converter circuit 128, the third current mirror stage 123, 124 is coupled with an auxiliary switch-on stage equipped with a first cascode field effect transistor 129 in the input arm of the third current mirror stage 123, 124. To this end, this first cascode field effect transistor 129 is connected, with its drain-source path, in series with the drain-source path of the first field effect transistor 123 of the third current mirror stage 123, 124, wherein a drain terminal of the first field effect transistor 123 is connected to a source terminal of the first cascode field effect transistor 129, and a drain terminal of the first cascode field effect transistor 129 is connected to the output terminal 119 of the first current mirror stage 117, 118 of the converter circuit 128. The gate terminal of the first field effect transistor 123 of the third current mirror stage 123, 124 is now connected to the drain terminal of the first cascode field effect transistor 129.

In addition, in the improved converter circuit 128, the third current mirror stage 123, 124 is coupled with an auxiliary switch-off stage. This comprises a first cascaded stage with, connected between the supply-voltage terminal 45 and the ground terminal 8, a series circuit comprising a first field effect transistor 130, an input transistor 131 of a fourth current mirror stage in the form of a field effect transistor, and a second cascode field effect transistor 132 in the input arm of the fourth current mirror stage. The first field effect transistor 130 of the first cascaded stage is inserted into the second current mirror stage 120, 121 in that its source terminal is connected to the ground terminal 8, and its gate terminal is connected to the gate terminal of the first field effect transistor 120 of the second current mirror stage 120, 121 of the converter circuit 128, and, together with this second current mirror stage 120, 121, is operated through the second differential output signal of the input stage 110, 111 of the converter circuit 128. The first field effect transistor 130 of the first cascaded stage hereby delivers, at its drain terminal, a fourth intermediate signal, which is, at least over sections, essentially proportional to the second intermediate signal. The second cascode field effect transistor 132 is connected in series, with its drain-source path, to the drain-source path of the input transistor 131 of the fourth current mirror stage, wherein a drain terminal of the input transistor 131 of the fourth current mirror stage is connected to a source terminal of the second cascode field effect transistor 132. The gate terminal of the input transistor 131 of the fourth current mirror stage is connected to the drain terminal of the second cascode field effect transistor 132.

The fourth current mirror stage in the auxiliary switch-off stage of the improved converter circuit 128 is provided to mirror the fourth intermediate signal delivered by the first field effect transistor 130 of the first cascaded stage into a fifth intermediate signal and to feed this into the third current mirror stage 123, 124, and comprises the input transistor 131, in the form of a field effect transistor, to deliver the fourth intermediate signal, and an output transistor 133, in the form of a field effect transistor, to deliver the fifth intermediate signal. The input transistor 131 and the output transistor 133 of the fourth current mirror stage 131, 133 are connected together with their gate terminals. Furthermore, the input transistor 131 and the output transistor 133 of the fourth current mirror stage 131, 133 are connected at their source terminals to the supply-voltage terminal 45. A drain terminal of the output transistor 133 of the fourth current mirror stage 131, 133 is connected to the gate terminals of the third current mirror stage 123, 124.

Finally, in the improved converter circuit 128, a cascode-bias-voltage generation circuit is provided to deliver a common cascode bias voltage to coupled-together gate terminals of the first and second cascode field effect transistors 129 and 132 respectively. This cascode-bias-voltage generation circuit comprises a series circuit comprising a first field effect transistor 134, a second field effect transistor 135 and a second constant current source 136. This series circuit is disposed between a terminal (here: ground terminal 8) carrying a sixth reference potential (here: ground potential) and a terminal (here: the supply-voltage terminal 45) carrying a seventh reference potential (here: the supply voltage). This first field effect transistor 134 is hereby connected, with its drain terminal, to a source terminal of the second field effect transistor 135. Gate terminals of this first and this second field effect transistor, 134, 135, are connected to each other, to a drain terminal of this second field effect transistor 135, to a first terminal of the second constant current source 136 and to the gate terminals of the first and second cascode field effect transistors 129 and 132, in order to deliver the common cascode bias voltage. A source terminal of the first field effect transistor 134 of the cascode-bias-voltage generation circuit is connected to the supply-voltage terminal 45, and a second terminal of the second constant current source 136 is delivered to the ground terminal 8.

The improved converter circuit 128 in accordance with FIG. 15 reduces the described interference effects and increases the edge steepness of the signal at the current node 126, and thereby the edge steepness of the electromagnetic oscillation delivered at the output 26 of the converter circuit 128, in that the voltage swing and the edge steepness of the signal at the junction point of the gate terminals of the field effect transistors 123 and 124 of the third current mirror stage are increased in operation. The first cascode field effect transistor 129 of the improved converter circuit 128 increases the load impedance of the current carried by the second field effect transistor 118 of the first current mirror stage 117, 118 of the converter circuit 128 (i.e. the current of the first intermediate signal), and thereby leads to an increased voltage swing towards lower voltage potentials, and to an increased edge steepness of the decaying signal at the junction point of the gate terminals of the field effect transistors 123 and 124 of the third current mirror stage 123, 124, as a result of which the second field effect transistor 124 of the third current mirror stage 123, 124 of the converter circuit 128 is energized more quickly and with lower impedance.

A rapid, steep switch-off of the second field effect transistor 124 of the third current mirror stage 123, 124 of the converter circuit 128 is realized by the output transistor 133 of the fourth current mirror stage 131, 133 of the auxiliary switch-off stage and its control signal, also steepened via the first cascaded stage 130, 131, 132, at the coupled-together gate terminals of the transistors 131, 133 of the fourth current mirror stage 131, 133. Through the output transistor 133 of the fourth current mirror stage 131, 133, the junction point of the gate terminals of the third current mirror stage 123, 124 is charged up to the positive supply voltage at the supply-voltage terminal 45, and the second field effect transistor 124 of the third current mirror stage 123, 124 is switched to very high resistivity, so that the second field effect transistor 121 of the second current mirror stage 120, 121 can discharge the current node 126 as rapidly as possible. The cascode bias voltage is set by the first and the second field effect transistor 134, 135 respectively, and by a constant current from the second constant-current source 136 of the cascode-bias-voltage generation circuit of the improved converter circuit 128. At its output 26, the improved converter circuit 128 delivers an extremely good, square-wave signal, which switches between the supply voltage and ground potential and which is also designated a "Digital, asymmetrically operated signal with CMOS levels".

All the circuit configurations described above can be constructed in a "CMOS process" or a "N-Well/P-Well process". A complementary structure, exchanging pMOS transistors for nMOS transistors and vice versa, with balancing of the supply-voltage potentials, is, of course, also possible.

LIST OF REFERENCE NUMBERS

1 Crystal oscillator
2 Input of the inverting amplifier 4
3 Output of the inverting amplifier 4
4 Inverting amplifier
5 Load resistor
6 Capacitor between input 2 of the amplifier 4 and ground terminal 8
7 Capacitor between output 3 of the amplifier 4 and ground terminal 8
8 Ground terminal
9 Resonant circuit capacitor (of the LC series resonant circuit)

10 Resonant circuit inductance (of the LC series resonant circuit)
11 Amplifier configuration in accordance with FIG. 6
12 First symmetrical (differential) input of the amplifier configuration 11, 49 and 64
13 Second symmetrical (differential) input of the amplifier configuration 11, 49 and 64
14 First symmetrical (differential) output of the amplifier configuration 11, 49 and 64
15 Second symmetrical (differential) output of the amplifier configuration 11, 49 and 64
16 First terminal of the crystal oscillator 1
17 Second terminal of the crystal oscillator 1
18 Bandpass filter configuration 18
19 First symmetrical input of the bandpass filter configuration 18
20 Second symmetrical input of the bandpass filter configuration 18
21 First symmetrical output of the bandpass filter configuration 18
22 Second symmetrical output of the bandpass filter configuration 18
23 Converter circuit
24 First differential input of the converter circuit 23 and 128
25 Second differential input of the converter circuits 23 and 128
26 Output of the converter circuits 23 and 128
27 Arrows to show the direction of the signal flow in the oscillator circuit
28 Capacitor in the equivalent network diagram of the crystal oscillator 1 (fundamental oscillation)
29 Inductance in the equivalent network diagram of the oscillator crystal 1 (fundamental oscillation)
30 Ohmic resistor in the equivalent circuit diagram of the oscillator crystal 1 (fundamental oscillation)
31 Terminal capacitor in the equivalent circuit diagram of the oscillator crystal 1
32 Capacitor in the equivalent circuit diagram of the oscillator crystal 1 (third harmonic)
33 Inductor in the equivalent circuit diagram of the oscillator crystal 1 (third harmonic)
34 Ohmic resistor in the equivalent circuit diagram of the oscillator crystal 1 (third harmonic)
35 Capacitor in the equivalent circuit diagram of the oscillator crystal 1 (fifth harmonic)
36 Inductor in the equivalent circuit diagram of the oscillator crystal 1 (fifth harmonic)
37 Ohmic resistor in the equivalent circuit diagram of the oscillator crystal 1 (fifth harmonic)
38 First field effect transistor of the differential input stage of the amplifier configuration 11, 49 and 64
39 Second field effect transistor of the differential input stage of the amplifier configuration 11, 49 and 64
40 Source terminal of the first field effect transistor 38
41 Source terminal of the second field effect transistor 39
42 Constant current source
43 First terminal of the constant current source 42
44 Second terminal of the constant current source 42
45 Supply voltage terminal
46 First output load transistor, connected to the first field effect transistor 38
47 Second output load transistor, connected to the second field effect transistor 39
48 Control voltage terminal for the output load transistors 46 and 47
49 Improved amplifier configuration in accordance with FIG. 8
50 Control-voltage generation stage in the improved amplifier configuration 49
51 Operating-point regulating stage in the improved amplifier configuration 49
52 Offset compensation device in the improved amplifier configuration 49
53 Terminal of the constant current source 54 of the control-voltage generation stage 50, connected to the supply-voltage terminal 45
54 Constant current source of the control-voltage generation stage 50
55 Field effect transistor of the control-voltage generation stage 50, bridged between its drain and gate terminals
56 Further field effect transistor of the control-voltage generation stage 50
57 Smoothing capacitor of the control-voltage generation stage 50
58 First field effect transistor of the operating-point regulating stage 51
59 Second field effect transistor of the operating-point regulating stage 51
60 Ohmic resistor of the first high-pass circuit
61 Capacitor of the first high-pass circuit
62 Ohmic resistor of the second high-pass circuit
63 Capacitor of the second high-pass circuit
64 Improved amplifier configuration in accordance with FIG. 9
65 Auxiliary starting circuit of the improved amplifier configuration 64 in accordance with FIG. 9
66 First field effect transistor of the auxiliary starting circuit 65
67 Second field effect transistor of the auxiliary starting circuit 65
68 Start-signal input of the auxiliary starting circuit 65
69 Delay stage of the auxiliary starting circuit 65
70 First bandpass stage of the bandpass filter configuration 18 in accordance with FIG. 10
71 Second bandpass stage of the bandpass filter configuration 18 in accordance with FIG. 10
72 Third bandpass stage of the bandpass filter configuration 18 in accordance with FIG. 10
73 First symmetrical input of the first bandpass stage 70
74 Second symmetrical input of the first bandpass stage 70
75 First symmetrical output of the first bandpass stage 70
76 Second symmetrical output of the first bandpass stage 70
77 First symmetrical input of the second bandpass stage 71
78 Second symmetrical input of the second bandpass stage 71
79 First symmetrical output of the second bandpass stage 71
80 Second symmetrical output of the second bandpass stage 71
81 First symmetrical input of the third bandpass stage 72
82 Second symmetrical input of the third bandpass stage 72
83 First symmetrical output of the third bandpass stage 72
84 Second symmetrical output of the third bandpass stage 72
85 First junction point between 75 and 77
86 Second junction point between 76 and 78
87 Third junction point between 79 and 81
88 Fourth junction point between 80 and 82
89 First field effect transistor of the first bandpass stage 70
90 Second field effect transistor of the first bandpass stage 70

91 First terminal of the constant current source 92
92 First constant current source of the first bandpass stage 70
93 Second terminal of the first constant current source 92
94 First high-pass capacitor of the first high-pass circuit of the first bandpass stage 70
95 First high-pass resistor of the first high-pass circuit of the first bandpass stage 70
96 First terminal of the first high-pass resistor 95 of the first high-pass circuit (first bandpass stage 70)
97 Second high-pass capacitor of the second high-pass circuit of the first bandpass stage 70
98 Second high-pass resistor of the second high-pass circuit of the first bandpass stage 70
99 First terminal of the second high-pass resistor 98 of the second high-pass circuit (first bandpass stage 70)
100 Second terminal of the first high-pass resistor 95 of the first high-pass circuit (first bandpass stage 70)
101 Second terminal of the second high-pass resistor 98 of the second high-pass circuit (first bandpass stage 70)
102 Output terminal 102 of the direct-bias-voltage generation stage 103 of the first bandpass stage 70
103 Direct-bias-voltage generation stage 103 of the first bandpass stage 70
104 Second constant current source 104 of the direct-bias-voltage generation stage 103 of the first bandpass stage 70
105 Third field effect transistor 105 of the direct-bias-voltage generation stage 103 of the first bandpass stage 70
106 First low-pass capacitor of the first low-pass circuit of the first bandpass stage 70
107 First low-pass resistor of the first low-pass circuit of the first bandpass stage 70
108 Second low-pass capacitor of the second low-pass circuit of the first bandpass stage 70
109 Second low-pass resistor of the second low-pass circuit of the first bandpass stage 70
110 First field effect transistor of the input stage of the converter circuit 23 and 128
111 Second field effect transistor of the input stage of the converter circuit 23 and 128
112 First constant current source of the converter circuit 23 and 128
113 First terminal of the first constant current source 112 of the converter circuit 23 and 128
114 Second terminal of the first constant current source 112 of the converter circuit 23 and 128
115 Second output terminal of the input stage of the converter circuit 23 and 128
116 First output terminal of the input stage of the converter circuit 23 and 128
117 First field effect transistor of the first current mirror stage 117, 118 of the converter circuit 23 and 128
118 Second field effect transistor of the first current mirror stage 117, 118 of the converter circuit 23 and 128
119 Output terminal of the first current mirror stage 117, 118 of the converter circuit 23 and 128
120 First field effect transistor of the second current mirror stage 120, 121 of the converter circuit 23 and 128
121 Second field effect transistor of the second current mirror stage 120, 121 of the converter circuit 23 and 128
122 Output terminal of the second current mirror stage 120, 121 of the converter circuit 23 and 128
123 First field effect transistor of the third current mirror stage 123, 124 of the converter circuit 23 and 128
124 Second field effect transistor of the third current mirror stage 123, 124 of the converter circuit 23 and 128
125 Output terminal of the third current mirror stage 123, 124 of the converter circuit 23 and 128
126 Current node (subtraction circuit) of the converter circuit 23 and 128
127 Output driver circuit of the converter circuit 23 and 128
128 Improved converter circuit
129 First cascode field effect transistor of the improved converter circuit 128
130 First field effect transistor of the first cascaded stage of the auxiliary switch-off stage of the improved converter circuit 128
131 Input transistor of the fourth current mirror stage 131, 133 of the auxiliary switch-off stage of the improved converter circuit 128
132 Second cascode field effect transistor in the input arm of the fourth current mirror stage 131, 133 of the auxiliary switch-off stage of the improved converter circuit 128
133 Output transistor of the fourth current mirror stage 131, 133 of the auxiliary switch-off stage of the improved converter circuit 128
134 First field effect transistor of the cascode-bias-voltage generation stage of the improved converter circuit 128
135 Second field effect transistor of the cascode-bias-voltage generation stage of the improved converter circuit 128
136 Second constant current source of the cascode-bias-voltage generation stage of the improved converter circuit 128

The invention claimed is:

1. A differential oscillator circuit for generating a high-frequency electromagnetic oscillation, comprising:
an amplifier configuration with two inputs and two outputs,
an oscillator crystal connected to the outputs of the amplifier configuration,
a bandpass filter configuration with two inputs and two outputs, which is connected, with inputs, to the oscillator crystal and the two outputs of the amplifier configuration connected to the oscillator crystal, and back coupled, with two outputs, to the inputs of the amplifier configuration,
wherein, through dimensioning of the amplitude-frequency characteristic or the phase-frequency characteristic of the bandpass filter configuration as a function of the amplitude-frequency characteristic and the phase-frequency characteristic of the amplifier configuration and the oscillator crystal, the oscillation condition is fulfilled exclusively for a selected harmonic of the oscillator crystal, and the high-frequency, electromagnetic oscillation formed by this selected harmonic of the oscillator crystal is available at the output of the bandpass filter configuration.

2. An oscillator circuit as claimed in claim 1, wherein the amplifier configuration is designed with, in each case, at least one pair of at least substantially symmetrical inputs and outputs for processing electromagnetic oscillations, operated at least substantially symmetrically relative to a first reference potential.

3. An oscillator circuit as claimed in claim 2, wherein the amplifier configuration comprises a differential amplifier circuit, which is equipped with two field effect transistors coupled at their source terminals, the gate terminals of which are each coupled with one of the differential inputs of the amplifier configuration, wherein a drain terminal of each field effect transistor forms one of the differential outputs of the amplifier configuration, each of which is further coupled, via a load path, which comprises at least one field effect transistor, designated an output load transistor, with a terminal carrying a second reference potential.

4. An oscillator circuit as claimed in claim 3, wherein the amplifier configuration comprises a control-voltage generation stage for generating a control voltage, which is supplied to gate terminals of the output load transistors.

5. An oscillator circuit as claimed in claim 4, wherein the control-voltage generation stage comprises a series circuit comprising a constant current source and a field effect transistor bridged between its drain terminal and gate terminal.

6. An oscillator circuit as claimed in claim 5, wherein the amplifier configuration comprises an operating-point regulating stage with three field effect transistors, a first of which is disposed in the first load path and a second of which is disposed in the second load path, each connected in series with the output load transistor there, and a third of which is connected in series with the series circuit comprising the constant current source and field effect transistor of the control-voltage generation stage, wherein a gate terminal of the first of the three field effect transistors of the operating-point regulating stage is connected to a first of the differential outputs of the amplifier configuration, wherein a gate terminal of the second of the three field effect transistors of the operating-point regulating stage is connected to a second of the differential outputs of the amplifier configuration, wherein a gate terminal of the third of the three field effect transistors of the operating-point regulating stage is connected to the gate terminals of the output load transistors and wherein the three field effect transistors of the operating-point regulating stage are routed, with their source terminals, to the terminal carrying the second reference potential.

7. An oscillator circuit as claimed in claim 3, wherein the amplifier configuration comprises an offset compensation device comprising, in each case, a high-pass circuit between:
   each of the differential inputs of the amplifier configuration,
   the gate terminal of the field effect transistor of the differential amplifier circuit comprising the amplifier configuration that is coupled with this differential input,
   the differential output formed by the drain terminal of said field effect transistor,
   wherein the limiting frequency is small as compared with the frequency operating range of the oscillator circuit.

8. An oscillator circuit as claimed in claim 7, wherein each of the high-pass circuits contains a capacitor, via which the differential input of the amplifier configuration is coupled with the gate terminal of the field effect transistor of the differential amplifier circuit comprising the amplifier configuration, and each of the high-pass circuits further contains an ohmic resistance element, via which the gate terminal of the field effect transistor of the differential amplifier circuit comprising the amplifier configuration is coupled with the differential output of the amplifier configuration formed by the drain terminal of the field effect transistor.

9. An oscillator circuit as claimed in claim 3, wherein the amplifier configuration is coupled with an auxiliary starting circuit, by means of which, during a predetermined period when the oscillator circuit is put into operation, a differential voltage is supplied to the gate terminals of the field effect transistors, coupled at their source terminals, of the differential amplifier circuit comprising the amplifier configuration.

10. An oscillator circuit as claimed in claim 9, wherein the auxiliary starting circuit preferably comprises:
   a first field effect transistor, which is disposed between the gate terminal of a first of the field effect transistors, coupled at their source terminals, of the differential amplifier circuit comprising the amplifier configuration, and a third reference potential;
   a second field effect transistor, which is disposed between the gate terminal of a second of the field effect transistors, coupled with their source terminals, of the differential amplifier circuit comprising the amplifier configuration, and the third reference potential;
   a start-signal input for supplying an at least largely pulse-shaped or step-shaped start signal when the oscillator circuit is put into operation;
   a delay stage;
   wherein the start-signal input is directly coupled with a gate terminal of the first field effect transistor of the auxiliary starting circuit and, via the delay stage, with a gate terminal of the second field effect transistor of the auxiliary starting circuit.

11. An oscillator circuit as claimed in claim 2, wherein the oscillator crystal takes the form of a two-terminal network and is connected with, in each case, one of its terminals to, in each case, one of the outputs of a pair of differential outputs of the amplifier configuration, in order to supply an electromagnetic oscillation emitted by the amplifier configuration in the form of a differential signal.

12. An oscillator circuit as claimed in claim 1, wherein the bandpass filter configuration is connected, with at least one pair of its differential inputs, to at least the pair of differential outputs of the amplifier configuration that are connected to the terminals of the oscillator crystal, and, with at least one pair of its differential outputs, to at least one pair of differential inputs of the amplifier configuration.

13. An oscillator circuit as claimed in claim 12, wherein the bandpass filter configuration is designed with a cascade connection of at least two bandpass stages.

14. An oscillator circuit as claimed in claim 13, wherein the bandpass stages are designed, each with a differential amplifier circuit having two field effect transistors coupled at their source terminals, and with one pair of differential inputs and one pair of differential outputs, wherein each one of the differential inputs is coupled, via one of the high-pass circuits, with one of the gate terminals of one of the field effect transistors, and each one of the drain terminals of the field effect transistors forms one of the differential outputs of the bandpass stages, each of which drain terminal is further connected, via one of the low-pass circuits, to a terminal carrying a fifth reference potential, wherein the differential inputs of a first of the bandpass stages disposed in a cascade connection form the differential inputs of the bandpass filter configuration that are connected to the terminals of the oscillator crystal, and wherein the differential outputs of a last of the bandpass stages disposed in a cascade connection form the differential outputs of the bandpass filter configuration that are connected to the differential inputs of the amplifier configuration.

15. An oscillator circuit as claimed in claim 14, wherein the high-pass circuits or the low-pass circuits take the form of RC networks.

16. An oscillator circuit as claimed in claim 15, wherein the RC networks are equipped with switchable ohmic resistors.

17. An oscillator circuit as claimed in claim 16, comprising a trimming circuit to trim the resistance values of the switchable ohmic resistors in the RC networks with a reference resistor.

18. An oscillator circuit as claimed in claim 1, comprising a converter circuit, coupled with at least one pair of differential outputs of the bandpass filter configuration, for converting the differential signal emitted by these differential outputs into an electromagnetic oscillation operated asymmetrically relative to a reference potential.

19. An oscillator circuit as claimed in claim 18, wherein the converter circuit comprises:
- an input stage designed as a differential amplifier with field effect transistors coupled at their source terminals, to which the differential signal to be converted is supplied;
- a first current mirror stage designed with field effect transistors coupled via their gate terminals, to mirror a first differential output signal of the input stage of the converter circuit into a first intermediate signal;
- a second current mirror stage designed with field effect transistors coupled via their gate terminals, to mirror a second differential output signal of the input stage of the converter circuit into a second intermediate signal;
- a third current mirror stage designed with field effect transistors coupled via their gate terminals, to mirror the first intermediate signal of the first current mirror stage of the converter circuit into a third intermediate signal;
- a subtraction circuit, designed as a current node, to subtract the second intermediate signal from the third intermediate signal;
- an output driver circuit; wherein the third current mirror stage is further coupled with:
- an auxiliary switch-on stage with a first cascode field effect transistor in the input arm of the third current mirror stage;
- an auxiliary switch-off stage, comprising:
- a first cascaded stage with a series circuit comprising:
- a first field effect transistor, which is incorporated into the second current mirror stage and which is operated, jointly with the second current mirror stage, by the second differential output signal of the input stage of the converter circuit, to emit a fourth intermediate signal, which is, at least over segments, essentially proportional to the second intermediate signal;
- an input transistor, designed as a field effect transistor, of a fourth current mirror stage;
- a second cascode field effect transistor in the input arm of the fourth current mirror stage;
- the fourth current mirror stage to mirror the fourth intermediate signal into a fifth intermediate signal and to supply it to the third current mirror stage, comprising:
- the input transistor, designed as a field effect transistor, to supply the fourth intermediate signal;
- an output transistor, designed as a field effect transistor, to emit the fifth intermediate signal; and
- wherein a cascode-bias-voltage generating circuit is provided to supply a common cascode bias voltage to gate terminals, coupled together, of the first and second cascode field effect transistors.

20. An oscillator circuit as claimed in claim 19, wherein the cascode-bias-voltage generating circuit comprises a series circuit comprising a first and a second field effect transistor and a constant current source, which is disposed between a terminal carrying a sixth reference potential and a terminal carrying a seventh reference potential, wherein this first field effect transistor is connected, with its drain terminal, to a source terminal of the second field effect transistor, and gate terminals of this first and this second field effect transistor are connected to each other, to a drain terminal of the second field effect transistor and to the gate terminals of the first and the second cascode field effect transistors to supply the common cascode bias voltage.

* * * * *